United States Patent
Gu

(10) Patent No.: US 9,721,674 B2
(45) Date of Patent: Aug. 1, 2017

(54) GOA UNIT AND METHOD FOR DRIVING THE SAME, GOA CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Xiaofang Gu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 147 days.

(21) Appl. No.: 14/801,719

(22) Filed: Jul. 16, 2015

(65) Prior Publication Data

US 2016/0125847 A1    May 5, 2016

(30) Foreign Application Priority Data

Oct. 31, 2014 (CN) .......................... 2014 1 0610676

(51) Int. Cl.
*G09G 3/36*      (2006.01)
*G11C 19/28*     (2006.01)

(52) U.S. Cl.
CPC ............ *G11C 19/28* (2013.01); *G09G 3/3677* (2013.01); *G09G 2300/0408* (2013.01); *G09G 2310/0286* (2013.01); *G09G 2310/08* (2013.01)

(58) Field of Classification Search
CPC .................. G11C 19/28; G09G 3/3677; G09G 2300/0408; G09G 2310/08; G09G 2310/0286

See application file for complete search history.

(56) References Cited

U.S. PATENT DOCUMENTS

2011/0057926 A1* 3/2011 Shang ................. G09G 3/3677
                                                    345/213
2012/0113088 A1* 5/2012 Han ..................... G09G 3/3674
                                                    345/212

FOREIGN PATENT DOCUMENTS

CN          102650751 A        8/2012
CN          102857207 A        1/2013
              (Continued)

OTHER PUBLICATIONS

First Chinese Office Action (including English translation) dated Feb. 1, 2016, for corresponding Chinese Application No. 201410610676.2.

*Primary Examiner* — Premal Patel

(74) *Attorney, Agent, or Firm* — Kinney & Lange, P.A.

(57) ABSTRACT

Embodiments of the present disclosure provide a GOA unit and a method for driving the same, a GOA circuit and a display device. The embodiments of the preset disclosure relate in particular to the field of display manufacture. The GOA unit specifically comprises: a first node control module and a second node control module, wherein the first node control module is connected to a first control node, an input signal terminal, a first clock signal terminal, and an output signal terminal, wherein the second node control module is connected to a reset signal terminal, a second clock signal terminal, a third clock signal terminal, a first level terminal, the output terminal, and the first control node. The embodiment of the present disclosure may simplify the structure of a GOA circuit and be used for display manufacture.

16 Claims, 13 Drawing Sheets

(56) References Cited

FOREIGN PATENT DOCUMENTS

| | | | |
|---|---|---|---|
| CN | 103000151 | A | 3/2013 |
| CN | 103489483 | A | 1/2014 |
| KR | 20000026582 | A | 5/2000 |

\* cited by examiner

GOA UNIT AND METHOD FOR DRIVING THE SAME, GOA CIRCUIT AND DISPLAY DEVICE

CROSS-REFERENCE TO RELATED APPLICATION(S)

This application claims priority to the Chinese Patent Application No. 201410610676.2, filed on Oct. 31, 2014, entitled "GOA UNIT AND METHOD FOR DRIVING THE SAME, GOA CIRCUIT AND DISPLAY DEVICE" which is incorporated herein by reference in its entirety.

TECHNICAL FIELD

The present disclosure relates to the field of display manufacture, and in particular, to a GOA unit and a method for driving the same, a GOA circuit and a display device.

BACKGROUND

Liquid Crystal Displays (LCD for short) provide advantages, such as light weight, small thickness, low power, or the like, and they are used in electronic products, such as TVs, mobile phones, displays, or the like. A liquid crystal display is composed of a matrix of pixels arranged in both of horizontal and vertical directions. When a liquid crystal display is displaying, a driving circuit outputs drive signals and individual pixels are scanned line by line. The driving circuit of the liquid crystal display mainly includes a gate driving circuit and a data driving circuit. Input display data is latched by the data driving circuit sequentially and converted to an analog signal, and then it is input to a data line of a liquid crystal display panel. Input clock signals are converted by the gate driving circuit into ON/OFF voltage signals, and applied to the gate lines of the liquid crystal display panel line by line.

Usually the gate driving circuit is disposed in the liquid crystal display panel in a form of Chip On Film (COF for short) or Chip On Glass (COG for short). Also, an integrated circuit unit made of Thin Film Transistors (TFT for short) may be formed in a liquid crystal display panel. However, a structure of a conventional gate driving circuit is rather complex and a process for manufacturing such a gate driving circuit is also complex. On the contrary, by the Gate driver On Array (GOA for short) technology, a gate driving circuit is integrated onto an array substrate of a liquid crystal display panel. Therefore, the gate switching integrated circuit portion is omitted, and the product cost is reduced in terms of cost for materials and manufacture process. A gate driving circuit, which is integrated onto an array substrate by the GOA technology, is also known as a GOA circuit or a shift register circuit. Therefore, it is a key problem in display manufacture that how to simplify a GOA circuit structure and how to simplify a process for manufacturing a GOA circuit.

SUMMARY

According to embodiments of the present disclosure, a GOA unit and a method for driving the same, a GOA circuit and a display device are provided for simplifying the structure of the GOA circuit, thereby reducing product cost in terms of materials and manufacture process.

To achieve the above objects, embodiments of the present disclosure propose technical solutions as follows.

According to a first aspect, a GOA unit is provided. The GOA unit comprises: a first node control module connected to a first control node, an input signal terminal, a first clock signal terminal, and an output signal terminal, the first node control module being configured to, under the control of an input signal from the input signal terminal, pull the voltage of the first control node to be same as the input signal from the input signal terminal, and further configured to, under the control of the first control node, output via the output signal terminal a first clock signal from the first clock signal terminal; and a second node control module connected to a reset signal terminal, a second clock signal terminal, a third clock signal terminal, a first level terminal, the output signal terminal, and the first control node, the second node control module being configured to, under the control of a reset signal of the reset signal terminal and a second clock signal of the second clock signal terminal, pull the voltage of the first control node to be same as a first voltage from the first level terminal, and further configured to, under the control of the first control node, a second clock signal from the second clock signal terminal, and a third clock signal from the third clock signal terminal, pull the voltage of the output signal terminal to be same as the first voltage of the first level terminal.

Alternatively, the first node control module comprises: a first transistor having a gate connected to a first terminal of the first transistor, the first terminal of the first transistor being connected to the input signal terminal and a second terminal of the first transistor being connected to the first control node; a second transistor having a gate connected to the first control node, a first terminal of the second transistor being connected to the first clock signal terminal and a second terminal of the second transistor being connected to the output signal terminal; and a first capacitor having a first plate connected to the first control node and a second plate connected to the output signal terminal.

Alternatively, the second node control module comprises: a third transistor having a gate connected to a first terminal of the third transistor, the first terminal of the third transistor being connected to the second clock signal terminal and a second terminal of the third transistor being connected to a first terminal of a fourth transistor; the fourth transistor having a gate connected to the first control node, a second terminal of the fourth transistor being connected the first level terminal; a fifth transistor having a gate connected to the second terminal of the third transistor, a first terminal of the fifth transistor being connected to the first control node and a second terminal of the fifth transistor being connected to the first level terminal; a sixth transistor having a gate connected to the second terminal of the third transistor, a first terminal of the sixth transistor being connected to the output signal terminal and a second terminal of the sixth transistor being connected to the first level terminal; a seventh transistor having a gate connected to the third clock signal terminal, a first terminal of the seventh transistor being connected to the output signal terminal and a second terminal of the seventh transistor being connected to the first level terminal; and an eighth transistor having a gate connected to the reset signal terminal, a first terminal of the eighth transistor being connected to the first control node and a second terminal of the eighth transistor being connected to the first level terminal.

Alternatively, the second node control module is further connected to the first clock signal terminal, the second node control module further comprising: a ninth transistor having a gate connected to a first terminal of the ninth transistor, the first terminal of the ninth transistor being connected to the first clock signal terminal and a second terminal of the ninth transistor being connected to the second terminal of the third transistor.

Alternatively, the second node control module is further connected to the first clock signal terminal, the second node control module further comprising: a ninth transistor having a gate connected to a first terminal of the ninth transistor, the first terminal of the ninth transistor being connected to the first clock signal terminal and a second terminal of the ninth transistor being connected to a first terminal of a tenth transistor; the tenth transistor having a gate connected to the first control node, the first terminal of the tenth transistor being connected to a gate of an eleventh transistor and a second terminal of the tenth transistor being connected to the first level terminal; the eleventh transistor having a gate connected to a gate of a twelfth transistor, a first terminal of the eleventh transistor being connected to the first control node and a second terminal of the eleventh transistor being connected to the first level terminal; and the twelfth transistor having a first terminal connected to the output signal terminal and a second terminal connected to the first level terminal.

According to a second aspect, a GOA circuit is provided. The GOA circuit comprises any of above GOA units.

Alternatively, the GOA circuit comprises: at least two cascaded GOA units which are referred to as the $1^{st}$ stage GOA unit, the $2^{nd}$ stage GOA unit, . . . , the $n^{th}$ stage GOA unit, wherein the $1^{st}$ stage GOA unit has an input signal terminal connected to a frame initial signal terminal which inputs a first frame initial signal, and the $1^{st}$ stage GOA unit has a reset signal terminal connected to an output signal terminal of the $2^{nd}$ stage GOA unit; wherein the $m^{th}$ stage GOA unit has an input signal terminal connected to an output signal terminal of the $m-1^{th}$ stage GOA unit, the $m^{th}$ stage GOA unit has a reset signal terminal connected to an output signal terminal of the $m+1^{th}$ stage GOA unit, and the $n^{th}$ stage GOA unit has a reset signal terminal connected to the frame initial signal terminal, where n is a positive integer equal to or greater than 2 and m={2, . . . , n−1}.

Alternatively, the GOA circuit comprises at least three cascaded GOA units, which are referred to as the $1^{st}$ stage GOA unit, the $2^{nd}$ stage GOA unit, . . . , the $n^{th}$ stage GOA unit, wherein the $1^{st}$ stage GOA unit has an input signal terminal connected to a frame initial signal terminal which inputs a first frame initial signal, and the $1^{st}$ stage GOA unit has a reset signal terminal connected to an output signal terminal of the $3^{rd}$ stage GOA unit; wherein the $k^{th}$ stage GOA unit has an input signal terminal connected to an output signal terminal of the $k-1^{th}$ stage GOA unit, the $k^{th}$ stage GOA unit has a reset signal terminal connected to an output signal terminal of the $k+2^{th}$ stage GOA unit, and wherein the $n-1^{th}$ stage GOA unit has a reset signal terminal connected to the frame initial signal terminal and the $n^{th}$ stage GOA unit has a reset signal terminal connected to the frame initial signal terminal, where n is a positive integer equal to or greater than 3 and k={2, . . . , n−3}.

According to a third aspect, a display device is provided. The display device comprises any of above GOA circuits.

According to a fourth aspect, a method for driving a GOA unit is provided. At phase 1, under the control of an input signal from an input signal terminal, a first node control module pulls a voltage of a first control node to be same as the input signal from the input signal terminal, and under the control of a third clock signal from a third clock signal terminal, a second node control module pulls the voltage of an output signal terminal to be same as a first voltage from a first level terminal; at phase 2, under the control of the first control node, the first node control module outputs via the output signal terminal a first clock signal from a first clock signal terminal; and at phase 3, under the control of a reset signal of a reset signal terminal and a second clock signal of a second clock signal terminal, the second node control module pulls the voltage of the first control node to be same as the first voltage from the first level terminal, and under the control of the second clock signal of the second clock signal terminal, the second node control module pulls the voltage of the output signal terminal to be same as the first voltage from the first level terminal.

Alternatively, the first node control module comprises: a first transistor, a second transistor, and a first capacitor, wherein the method further comprises: at the phase 1, the first transistor is turned on, the second transistor is turned on, and the first capacitor is charged; at the phase 2, the first transistor is turned off, the second transistor is turned on, and the first capacitor is kept at a high level; and at the phase 3, the first transistor is turned off, the second transistor is turned off, and the first capacitor is discharged.

Alternatively, the second node control module comprises: a third transistor, a fourth transistor, a fifth transistor, a sixth transistor, a seventh transistor, and an eighth transistor, wherein the method further comprises: at the phase 1, the third transistor is turned off, the fourth transistor is turned on, the fifth transistor is turned off, the sixth transistor is turned off, the seventh transistor is turned on, and the eighth transistor is turned off; at the phase 2, the third transistor is turned off, the fourth transistor is turned on, the fifth transistor is turned off, the sixth transistor is turned off, the seventh transistor is turned off, and the eighth transistor is turned off; and at the phase 3, the third transistor is turned on, the fourth transistor is turned off, the fifth transistor is turned on, the sixth transistor is turned on, the seventh transistor is turned off, and the eighth transistor is turned on.

Alternatively, the second node control module further comprises: a ninth transistor, wherein at the phase 1, the ninth transistor is turned off; at the phase 2, the ninth transistor is turned on; and at the phase 3, the ninth transistor is turned off.

Alternatively, the second node control module further comprises: a ninth transistor, a tenth transistor, an eleventh transistor, and a twelfth transistor, wherein at the phase 1, the ninth transistor is turned off, the tenth transistor is turned on, the eleventh transistor is turned off, and the twelfth transistor is turned off; at the phase 2, the ninth transistor is turned on, the tenth transistor is turned on, the eleventh transistor is turned off, and the twelfth transistor is turned off; and at the phase 3, the ninth transistor is turned off, the tenth transistor is turned off, the eleventh transistor is turned off, and the twelfth transistor is turned off.

According to a fifth aspect, a method for driving a GOA unit is provided. At phase 1, under the control of an input signal from an input signal terminal, a first node control module pulls a voltage of a first control node to be same as the input signal from the input signal terminal, and under the control of a third clock signal from a third clock signal terminal, a second node control module pulls the voltage of an output signal terminal to be same as a first voltage from a first level terminal; at phase 2, under the control of the first control node, the first node control module outputs via the output signal terminal a first clock signal from a first clock signal terminal; at phase 3, under the control of a second clock signal of a second clock signal terminal and the voltage of the first control node, the second node control module pulls the voltage of the second clock signal terminal to be same as the first voltage from the first level terminal;

and at phase 4, under the control of a reset signal of a reset signal terminal, the second node control module pulls the voltage of the first control node to be same as the first voltage from the first level terminal, and under the control of the third clock signal of the third clock signal terminal, the second node control module pulls the voltage of the output signal terminal to be same as the first voltage from the first level terminal.

Alternatively, the first node control module comprises: a first transistor, a second transistor, and a first capacitor, wherein the method further comprises: at the phase 1, the first transistor is turned on, the second transistor is turned on, and the first capacitor is charged; at the phase 2, the first transistor is turned off, the second transistor is turned on, and the first capacitor is kept at a high level; at the phase 3, the first transistor is turned off, the second transistor is turned on, and the first capacitor is kept at a high level; and at the phase 4, the first transistor is turned off, the second transistor is turned off, and the first capacitor is discharged.

Alternatively, the second node control module comprises: a third transistor, a fourth transistor, a fifth transistor, a sixth transistor, a seventh transistor, and an eighth transistor, wherein the method further comprises: at the phase 1, the third transistor is turned off, the fourth transistor is turned on, the fifth transistor is turned off, the sixth transistor is turned off, the seventh transistor is turned on, and the eighth transistor is turned off; at the phase 2, the third transistor is turned off, the fourth transistor is turned on, the fifth transistor is turned off, the sixth transistor is turned off, the seventh transistor is turned off, and the eighth transistor is turned off; at the phase 3, the third transistor is turned on, the fourth transistor is turned on, the fifth transistor is turned off, the sixth transistor is turned off, the seventh transistor is turned off, and the eighth transistor is turned off; and at the phase 4, the third transistor is turned off, the fourth transistor is turned off, the fifth transistor is turned off, the sixth transistor is turned off, the seventh transistor is turned off, and the eighth transistor is turned on.

Alternatively, the second node control module further comprises: a ninth transistor, wherein at the phase 1, the ninth transistor is turned off; at the phase 2, the ninth transistor is turned on; at the phase 3, the ninth transistor is turned off; and at the phase 4, the ninth transistor is turned off.

Alternatively, the second node control module further comprises: a ninth transistor, a tenth transistor, an eleventh transistor, and a twelfth transistor, wherein at the phase 1, the ninth transistor is turned off, the tenth transistor is turned on, the eleventh transistor is turned off, and the twelfth transistor is turned off; at the phase 2, the ninth transistor is turned on, the tenth transistor is turned on, the eleventh transistor is turned off, and the twelfth transistor is turned off; at the phase 3, the ninth transistor is turned off, the tenth transistor is turned on, the eleventh transistor is turned off, and the twelfth transistor is turned off; and at the phase 4, the ninth transistor is turned off, the tenth transistor is turned off, the eleventh transistor is turned off, and the twelfth transistor is turned off.

The above GOA units comprise: a first node control module and a second node control module. By integrating the first node control module and the second node control module onto the array substrate of the display panel, only the first node control module and the second node control module are used in each GOA unit to provide signals to gate lines of respective pixel lines in the pixel circuit. Compared to a conventional GOA unit, a GOA unit according to an embodiment of the present disclosure is simpler in terms of structure, and the structure of a GOA circuit is further simplified, thereby reducing product cost in terms of material and manufacture process.

BRIEF DESCRIPTION OF THE DRAWINGS

To illustrate embodiments of the present disclosure of technical solutions in the related art in a clearer manner, a brief introduction with regard to the figures described in the embodiments will be given below. Obviously, the figures in the following description are merely some embodiments of the present disclosure. For those ordinarily skilled in the art, other figures may be derived from these figures without any inventive effort.

DETAILED DESCRIPTION

A clear and thorough description of the technical solutions of embodiments of the present disclosure will be given below with reference to figures of the embodiments of the present disclosure. Obviously, the described embodiments are merely part of embodiments of the present disclosure, and not all of them. Based on the embodiments of the present disclosure, all other embodiments which may be derived by those skilled in the art without any inventive effort will fall into the scope of the present disclosure.

Any transistor adopted in all embodiments of the present disclosure may be a thin film transistor or a field effect transistor or any other device with similar characteristics. Depending on its effect in a circuit, most of transistors adopted in embodiments of the present disclosure are switching transistors. Since a source and a drain of a switching transistor adopted herein are symmetric, the source and the drain may be interchanged. In embodiments of the present disclosure, to distinguish between two other electrodes than a gate, a source therein is referred to as a first terminal and a drain is referred to as a second terminal. In figures, a middle terminal of a transistor is specified as a gate, a signal input terminal is specified as a source, and a signal output terminal is specified as a drain. Furthermore, the switching transistors adopted in the embodiments of the present disclosure comprise P-type switching transistors and N-type switching transistors, wherein the P-type switching transistors are turned on when the gate is at a low level and off when the gate is at a high level, and wherein the N-type switching transistors are turned on when the gate is at a high level and off when the gate is at a low level. The transistors adopted in the embodiments of the present disclosure further comprise driving transistors. The driving transistors comprise P-type and N-type driving transistors, wherein the P-type driving transistors are in an amplified state or a saturated state when the gate voltage is at a low level (the gate voltage is less than the source voltage) and the absolute value of the voltage difference between the gate and the source is greater than a threshold voltage, and wherein the N-type driving transistors are in an amplified state or a saturated state when the gate voltage is at a high level (the gate voltage is greater than the source voltage) and the absolute value of the voltage difference between the gate and the source is greater than a threshold voltage.

Figure 1:
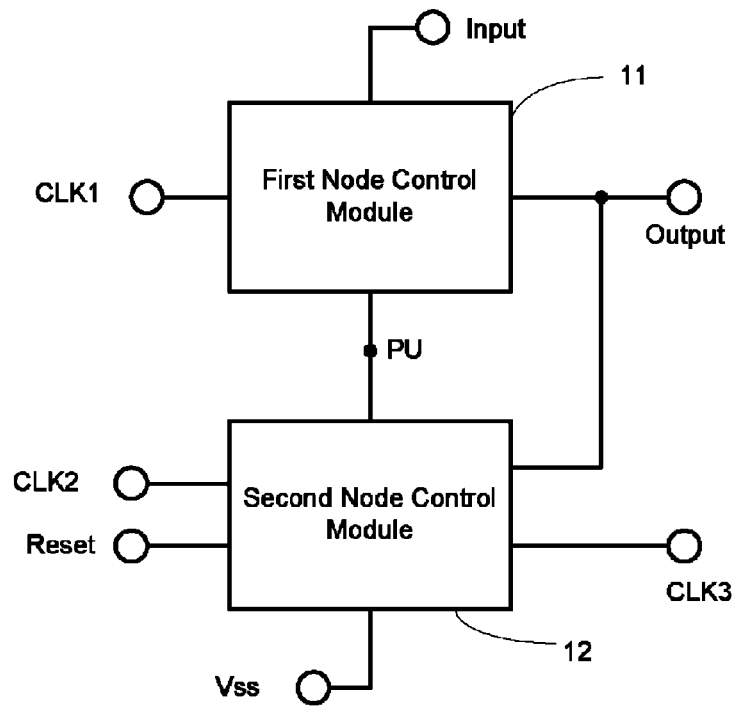
FIG. 1 is a diagram showing a structure of a GOA unit according to an embodiment of the present disclosure.

As shown in FIG. 1, an embodiment of the present disclosure provides a GOA unit comprising a first node control module 11 and a second node control module 12.

The first node control module 11 is connected to a first control node "PU", an input signal terminal "Input", a first clock signal terminal "CLK1", and an output signal terminal "Output". The first node control module 11 is configured to, under the control of the input signal terminal "Input", input the input voltage of the input signal terminal "Input" to the first control node "PU". The first node control module 11 is further configured to, under the control of the first control node "PU", output via the output signal terminal "Output" a first clock signal from the first clock signal terminal "CLK1".

The second node control module 12 is connected to a reset signal terminal "RST", a second clock signal terminal "CLK2", a third clock signal terminal "CLK3", a first level terminal "Vss", the output signal terminal "Output", and the first control node "PU". The second node control module 12 is configured to, under the control of a reset signal of the reset signal terminal "Reset" and a second clock signal of the second clock signal terminal "CLK2", pull the first control node "PU" to be same as a first voltage from the first level terminal "Vss". The second node control module 22 is further configured to, under the control of the first control node "PU", a second clock signal from the second clock signal terminal "CLK2", and a third clock signal from the third clock signal terminal "CLK3", pull the voltage of the output signal terminal "Output" to be same as the first voltage of the first level terminal "Vss".

The above GOA unit comprises: a first node control module and a second node control module. By integrating the first node control module and the second node control module onto the array substrate of the display panel, only the first node control module and the second node control module are used in each GOA unit to provide signals to gate lines of respective pixel lines in the pixel circuit. Compared to a conventional GOA unit, a GOA unit according to an embodiment of the present disclosure has a simpler structure, and the structure of a GOA circuit is further simplified, thereby reducing product cost in terms of material and manufacture process.

Figure 2:
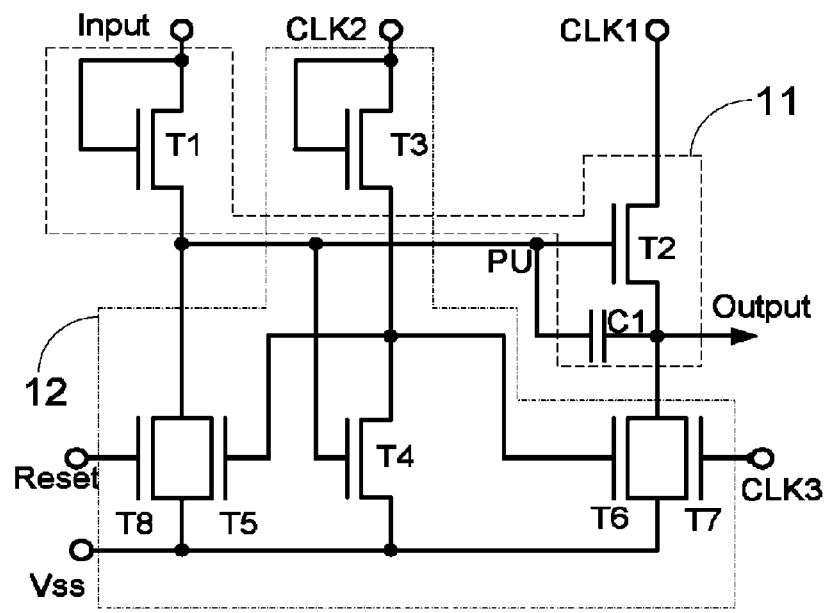
FIG. 2 is a circuit diagram showing a structure of a GOA unit according to an embodiment of the present disclosure.

To be specific, as shown in FIG. 2, the first node control module 11 comprises: a first transistor "T1", a second transistor "T2", and a first capacitor "C1".

The first transistor "T1" has a gate connected to a first terminal of the first transistor "T1", the first terminal of the first transistor "T1" being connected to the input signal terminal "Input" and a second terminal of the first transistor "T1" being connected to the first control node "PU".

The second transistor "T2" has a gate connected to the first control node "PU", a first terminal of the second transistor "T2" being connected to the first clock signal terminal "CLK1" and a second terminal of the second transistor "T2" being connected to the output signal terminal "Output".

The first capacitor has a first plate connected to the first control node "PU" and a second plate connected to the output signal terminal "Output".

The second node control module 12 comprises: a third transistor "T3", a fourth transistor "T4", a fifth transistor "T5", a sixth transistor "T6", a seventh transistor "T7", and a eighth transistor "T8".

The third transistor "T3" has a gate connected to a first terminal of the third transistor "T3", the first terminal of the third transistor "T3" being connected to the second clock signal terminal "CLK2" and a second terminal of the third transistor "T3" being connected to a first terminal of the fourth transistor "T4".

The fourth transistor "T4" has a gate connected to the first control node "PU", a second terminal of the fourth transistor "T4" being connected the first level terminal "Vss".

The fifth transistor "T5" has a gate connected to the second terminal of the third transistor "T3", a first terminal of the fifth transistor "T5" being connected to the first control node "PU" and a second terminal of the fifth transistor "T5" being connected to the first level terminal "Vss".

The sixth transistor "T6" has a gate connected to the second terminal of the third transistor "T3", a first terminal of the sixth transistor "T6" being connected to the output signal terminal "Output" and a second terminal of the sixth transistor "T6" being connected to the first level terminal "Vss".

The seventh transistor "T7" has a gate connected to the third clock signal terminal "CLK3", a first terminal of the seventh transistor "T7" being connected to the output signal terminal "Output" and a second terminal of the seventh transistor "T7" being connected to the first level terminal "Vss".

The eighth transistor "T8" has a gate connected to the reset signal terminal "Reset", a first terminal of the eighth transistor "T8" being connected to the first control node "PU" and a second terminal of the eighth transistor "T8" being connected to the first level terminal "Vss".

The above GOA unit is composed of 8 transistors and 1 capacitor. Compared to a 12T1C GOA unit structure composed of 12 transistors and 1 capacitor in the related art, the structure of the GOA unit is simplified, and the structure of the GOA circuit is further simplified, thereby reducing product cost in terms of material and manufacture process. Further, space for wiring occupied by the GOA unit in the display panel can be reduced, and therefore the requirement for a narrow bezel may be further met.

Figure 3:
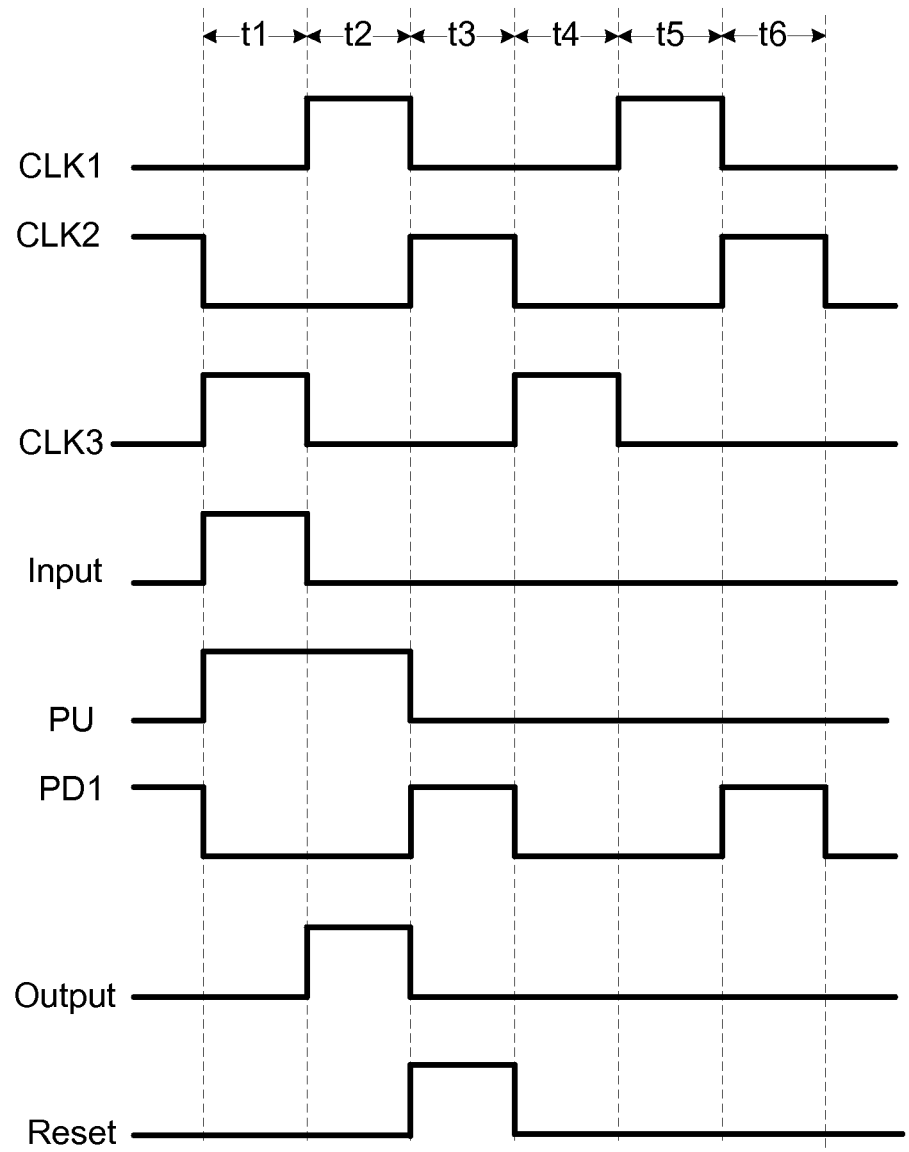
FIG. 3 is a signal timing state diagram for the circuit diagram showing the structure of the GOA unit as shown in FIG. 2 according to an embodiment of the present disclosure.

Below, the operation principle of the GOA unit shown in FIG. 2 will be explained, with reference to the signal timing state diagram shown in FIG. 3 in which an example where all switching transistors in FIG. 2 are N-type transistors which are turned on at a high level and where a second terminal of the third transistor "T3" is connected to a second control node "PD1" is given. FIG. 3 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the output signal of the output signal terminal "Output", and the reset signal of the reset signal terminal "Reset". The first level terminal "Vss" provides a first voltage. For example, the first level is a low level. Further, the first level terminal "Vss" may also provide a ground voltage. As shown in FIG. 3, six timing states are provided comprising: t1, t2, t3, t4, t5, and t6.

At the phase t1, CLK1, CLK2, and Reset are at low levels, CLK3 and Input are at high levels, T1, T2, T4, and T7 are turned on, and T3, T5, T6, and T8 are turned off. At this phase, C1 is charged by receiving the input signal via T1, and PU is at a high level; PD1 receives the first level via T4, and therefore PD1 is at a low level; and Output receives the first level terminal "Vss" via T7 such that the output voltage of Output is 0, thereby ensuring the stability of the output signals.

At the phase t2, CLK2, CLK3, Input, and Reset are at low levels, CLK1 is at a high level, T2 and T4 are turned on, and T1, T5, T3, T6, T7, and T8 are turned off. At this phase, PU is kept at a high level due to a bootstrapping effect, and T2 and T4 are turned on; PD1 receives the first level via T4, and therefore PD1 is at a low level and T5 and T6 are turned off; and CLK1 inputs the first clock signal to Output via T2.

At the phase t3, CLK1, CLK3, and Input are at low levels, CLK2 and Reset are at high levels, T3, T5, T6, and T8 are turned on, and T1, T2, T4, and T7 are turned off. At this phase, CLK2 inputs a high level signal to the second control node PD1 via T3, and therefore PD1 is at a high level, and thus T5 and T6 are turned on, Reset inputs a high level signal to the gate of T8 and T8 is turned on; C1 is discharged by receiving the first voltage via T5 and T8, PU is at a low level, and T2 and T4 are turned off; and Output receives the first voltage via T6.

At the phase t4, CLK1, CLK2, Input, and Reset are at low levels, CLK3 is at a high level, T7 is turned on, and T1, T2, T3, T4, T5, T6, and T8 are turned off. At this phase, Output receives the first voltage via T7.

At the phase t5, CLK2, CLK3, Input, and Reset are at low levels, CLK1 is at a high level, and all transistors are turned off. The high level signals of CLK1 will not be transmitted to Output, and Output is kept at a low level.

At the phase t6, CLK1, CLK3, Input, and Reset are at low levels, CLK2 is at a high level, T5 and T6 are turned on, and T1, T2, T3, T4, T7, and T8 are turned off. At this phase, Output receives the first voltage via T6, C1 is discharged by receiving the first voltage via T5, and PU is at a low level.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t6, and this is determined by the number of lines scanned by the GOA circuit. However, after the phase t6 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t4, t5, and t6, respectively.

From the above operation principle of the GOA unit, T1 is turned on only when Input is at a high level, and Input is at a high level in only one phase (t1) during a duty cycle; T2 and T4 are turned on only when PU is at a high level, and PU is at a high level in only two phases (t1 and t2) during a duty cycle; T8 is turned on only when Reset is at a high level, and Reset is at a high level in only one phase (t3) during a duty cycle; T3 is turned on only when CLK2 is at a high level; T5 and T6 are turned on only when CLK2 is at a high level and PU is at a low level; T7 is turned on only when CLK3 is at a high level, and the pulses input by CLK2 and CLK3 are periodic signals with a duty ratio of 1:2. Therefore, the maximum ON time for all transistors in the above GOA unit is 1/3 of one duty cycle, and therefore the life of the GOA unit may be improved.

As shown in FIG. 3, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by 2T/3 relative to the input signal.

Figure 4:
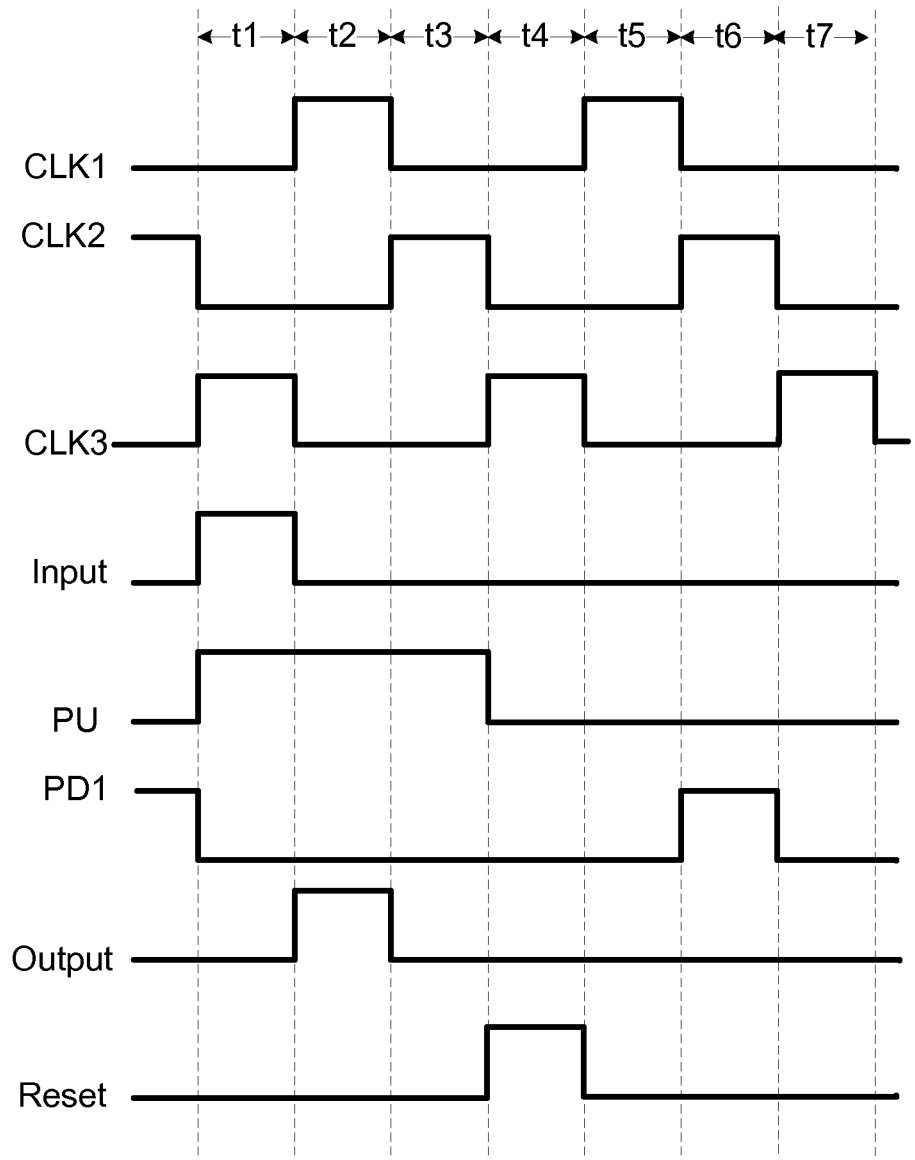
FIG. 4 is another signal timing state diagram for the circuit diagram showing the structure of the GOA unit as shown in FIG. 2 according to an embodiment of the present disclosure.

Further, an embodiment of the present disclosure provides another timing state diagram illustrating the operation principle of the GOA unit shown in FIG. 2. In the timing state diagram, an example where all switching transistors in FIG. 2 are N-type transistors which are turned on at a high level and where the second terminal of the third transistor "T3" is connected to a second control node "PD1" is given. FIG. 4 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the output signal of the output signal terminal "Output", and the reset signal of the reset signal terminal "Reset". The first level terminal "Vss" provides a first voltage. An exemplary first level terminal "Vss" may provide a ground voltage, i.e., zero voltage. As shown in FIG. 4, seven timing states are provided comprising: t1, t2, t3, t4, t5, t6, t7.

At the phase t1, CLK1, CLK2, and Reset are at low levels, CLK3 and Input are at high levels, T1, T2, T4, and T7 are turned on, and T3, T5, T6, and T8 are turned off. At this phase, C1 is charged by receiving the input signal via T1, and PU is at a high level; PD1 receives the first voltage via T4, and therefore PD1 is at a low level; and Output receives the first voltage via T7 such that the output voltage of Output is 0, thereby ensuring the stability of the output signals.

At the phase t2, CLK2, CLK3, Input, and Reset are at low levels, CLK1 is at a high level, T2 and T4 are turned on, and T1, T5, T3, T6, T7, and T8 are turned off. At this phase, PU is kept at a high level due to a bootstrapping effect, and T2 and T4 are turned on; PD1 receives the first voltage via T4, and therefore PD1 is at a low level and T5 and T6 are turned off; and CLK1 inputs the first clock signal to Output via T2.

At the phase t3, CLK1, CLK3, Input, and Reset are at low levels, CLK2 is at a high level, T2, T3, and T4 are turned on, and T1, T5, T6, T7, and T8 are turned off. At this phase, CLK2 receives the first voltage via T3 and T4.

At the phase t4, CLK1, CLK2, and Input are at low levels, CLK3 and Reset are at high levels, T7 and T8 are turned on, and T1, T2, T3, T4, T5, and T6 are turned off. At this phase, Output receives the first voltage via T7, C1 is discharged by receiving the first voltage via T8, and the voltage of PU is pulled low.

At the phase t5, CLK2, CLK3, Input, and Reset are at low levels, CLK1 is at a high level. At this phase, all transistors are turned off. The high level signals of CLK1 will not be transmitted to Output, and Output is kept at a low level.

At the phase t6, CLK1, CLK3, Input, and Reset are at low levels, CLK2 is at a high level, T5 and T6 are turned on, and T1, T2, T3, T4, T7, and T8 are turned off. At this phase, Output receives the first voltage via T6, C1 is discharged by receiving the first voltage via T5, and PU is at a low level.

At the phase t7, CLK1, CLK2, Reset, and Input are at low levels, CLK3 is at a high level, T7 is turned on, and T1, T2, T3, T4, T5, T6, and T8 are turned off. At this phase, Output receives the first voltage via T7.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t7, and this is determined by the number of lines scanned by the GOA circuit. However, after the phase t7 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t5, t6, and t7, respectively.

From the above operation principle of the GOA unit, T1 is turned on only when Input is at a high level, and Input is at a high level in only one phase (t1) during a duty cycle; T2 and T4 are turned on only when PU is at a high level, and PU is at a high level in only three phases (t1, t2, and t3) during a duty cycle; T8 is turned on only when Reset is at a high level, and Reset is at a high level in only one phase (t4) during a duty cycle; T3, T5 and T6 are turned on only when CLK2 is at a high level; T7 is turned on only when CLK3 is at a high level, and the pulses input by CLK2 and CLK3 are periodic signals with a duty ratio of 1:2. Therefore, the maximum ON time for all transistors in the above GOA unit is 1/3 of one duty cycle, and therefore the life of the GOA unit may be improved.

As shown in FIG. 4, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by T relative to the input signal.

Figure 5:
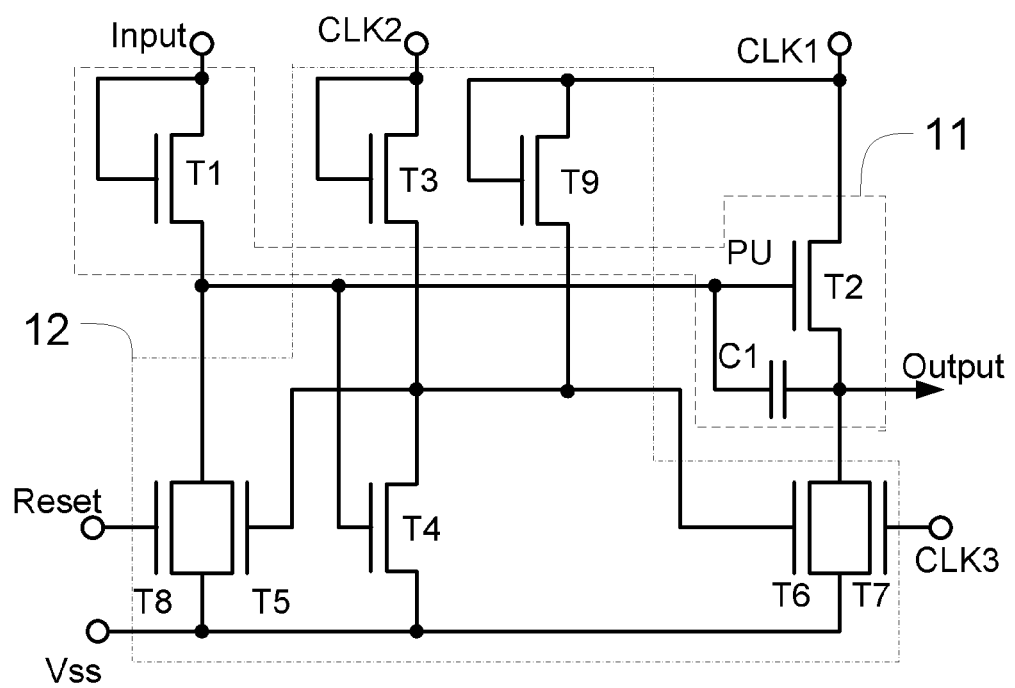
FIG. 5 is a circuit diagram showing a structure of another GOA unit according to an embodiment of the present disclosure.

As shown in FIG. 5, an embodiment of the present disclosure provides a GOA unit comprising a first node control module 11 and a second node control module 12.

The first node control module 11 comprises: a first transistor "T1", a second transistor "T2", and a first capacitor "C1".

For the connection modes of T1, T2, and C1, the connection modes of T1, T2, and C1 in the embodiment shown in FIG. 2 may be referred to, and the detailed description thereof is omitted for simplicity.

The second node control module 12 comprises: a third transistor T3, a fourth transistor T4, a fifth transistor T5, a sixth transistor T6, a seventh transistor T7, and an eighth transistor T8.

For the connection modes of T3, T4, T5, T6, T7, and T8, the connection modes of T3, T4, T5, T6, T7, and T8 in the embodiment shown in FIG. 2 may be referred to, and the detailed description thereof is omitted for simplicity.

Further, the second node control module 12 is further connected to the first clock signal terminal "CLK1", and the second node control module 12 further comprises: a ninth transistor "T9".

The ninth transistor "T9" has a gate connected to a first terminal of the ninth transistor "T9", the first terminal of the ninth transistor "T9" being connected to the first clock signal terminal "CLK1" and a second terminal of the ninth transistor "T9" being connected to the second terminal of the third transistor "T3".

The above GOA unit is composed of 9 transistors and 1 capacitor. Compared to a 12T1C GOA unit structure composed of 12 transistors and 1 capacitor in the related art, the structure of the GOA unit is simplified, and the structure of the GOA circuit is further simplified, thereby reducing product cost in terms of material and manufacture process. Further, space for wiring occupied by the GOA unit in the display panel can be reduced, and therefore the requirement for a narrow bezel may be further met.

Figure 6:
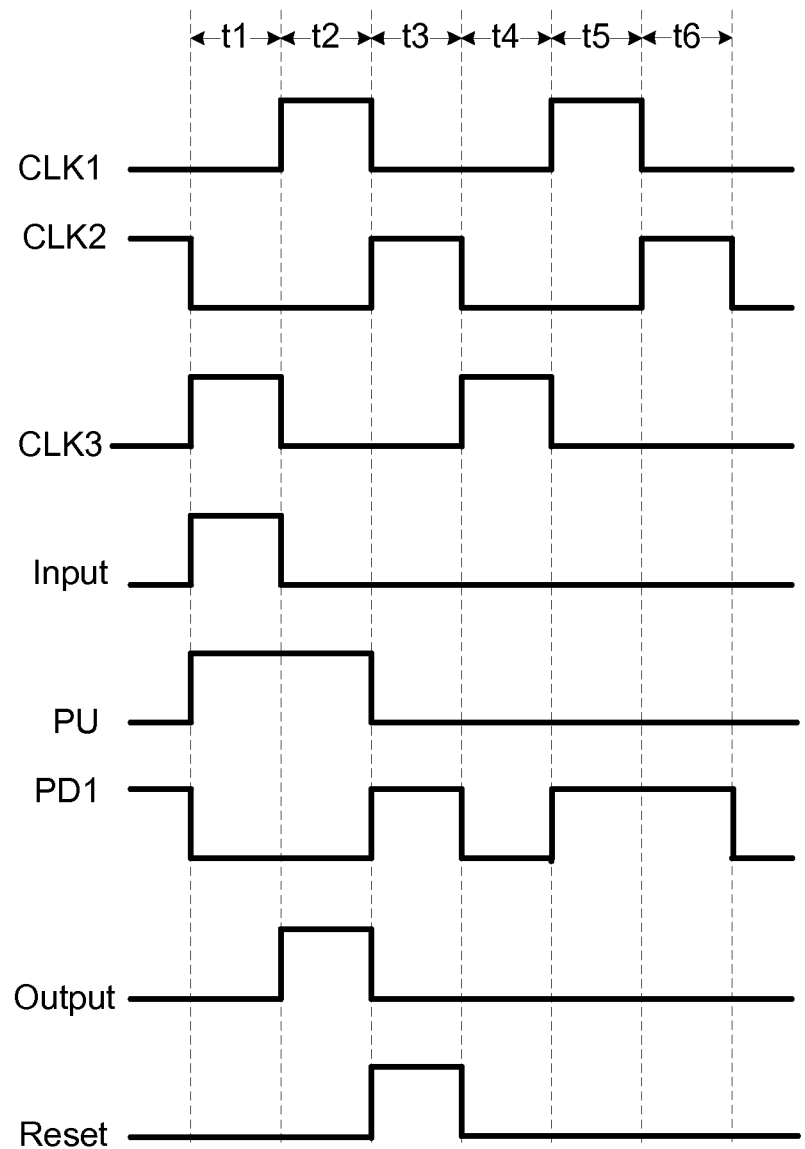
FIG. 6 is a signal timing state diagram for the circuit diagram showing the structure of the GOA unit as shown in FIG. 5 according to an embodiment of the present disclosure.

Below, the operation principle of the GOA unit shown in FIG. 5 will be explained, with reference to the timing state diagram shown in FIG. 6 in which an example where all switching transistors in FIG. 5 are N-type transistors which are turned on at a high level and where a second terminal of the third transistor "T3" is connected to a second control node "PD1" is given. FIG. 6 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the output signal of the output signal terminal "Output", and the reset signal of the reset signal terminal "Reset". The first level terminal "Vss" provides a first voltage. For example, the first voltage of the first level terminal "Vss" is a low level. An exemplary the first level terminal "Vss" may provide a ground voltage, i.e., zero voltage. As shown in FIG. 6, six timing states are provided comprising: t1, t2, t3, t4, t5, and t6.

At the phase t1, CLK1, CLK2, and Reset are at low levels, CLK3 and Input are at high levels, T1, T2, T4, and T7 are turned on, and T3, T5, T6, T8, and T9 are turned off. At this phase, C1 is charged by receiving the input signal via T1, and PU is at a high level; PD1 receives the first voltage via T4, and PD1 is at a low level; and Output receives the first voltage via T7 such that the output voltage of Output is 0, thereby ensuring the stability of the output signals.

At the phase t2, CLK2, CLK3, Input, and Reset are at low levels, CLK1 is at a high level, T2, T4 and T9 are turned on, and T1, T3, T5, T6, T7, and T8 are turned off. At this phase, PU is kept at a high level due to a bootstrapping effect, and T2 and T4 are turned on; PD1 receives the first voltage via T4, and therefore PD1 is at a low level and T5 and T6 are turned off; and CLK1 inputs the first clock signal to Output via T2.

At the phase t3, CLK1, CLK3, and Input are at low levels, CLK2 and Reset are at high levels, T3, T5, T6, and T8 are turned on, and T1, T2, T4, T7, and T9 are turned off. At this phase, CLK2 inputs a high level signal to the second control node PD1 via T3, and therefore PD1 is at a high level, and therefore T5 and T6 are turned on, Reset is at a high level and T8 is turned on; C1 is discharged by receiving the first voltage via T5 and T8, PU is at a low level, and T2 and T4 are turned off; and Output receives the first voltage via T6.

At the phase t4, CLK1, CLK2, Input, and Reset are at low levels, CLK3 is at a high level, T7 is turned on, and T1, T2, T3, T4, T5, T6, T8, and T9 are turned off. At this phase, Output receives the first voltage via T7.

At the phase t5, CLK2, CLK3, Input, and Reset are at low levels, CLK1 is at a high level, T9, T5, and T6 are turned on, and T1, T2, T3, T4, T7, and T8 are turned off. At this phase, since T2 is turned off, the high level signals of CLK1 will not be transmitted to Output, and C1 is discharged by receiving the first voltage via T5. PU is at a low level, and Output receives the first voltage via T6.

At the phase t6, CLK1, CLK3, Input, and Reset are at low levels, CLK2 is at a high level, T5 and T6 are turned on, and T1, T2, T3, T4, T7, T8, and T9 are turned off. At this phase, C1 is discharged by receiving the first voltage via T5, PU is at a low level, and Output receives the first voltage via T6.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t6, and this is determined by the number of lines scanned by the GOA circuit. However, after the phase t6 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t4, t5, and t6, respectively.

In the above embodiment, as compared with the GOA unit shown in FIG. 2, a ninth transistor "T9" is added. When this GOA unit does not provide output and CLK1 is at a high level, the fifth transistor "T5" and the sixth transistor "T6" are turned on. Further, the first voltage of the first level terminal may be pulled to be same as the first control node, and the voltage of the output signal terminal may also be pulled to be same as the first voltage of the first level terminal, thereby ensuring the stability of the output signals.

As shown in FIG. 6, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by 2T/3 relative to the input signal.

Figure 7:
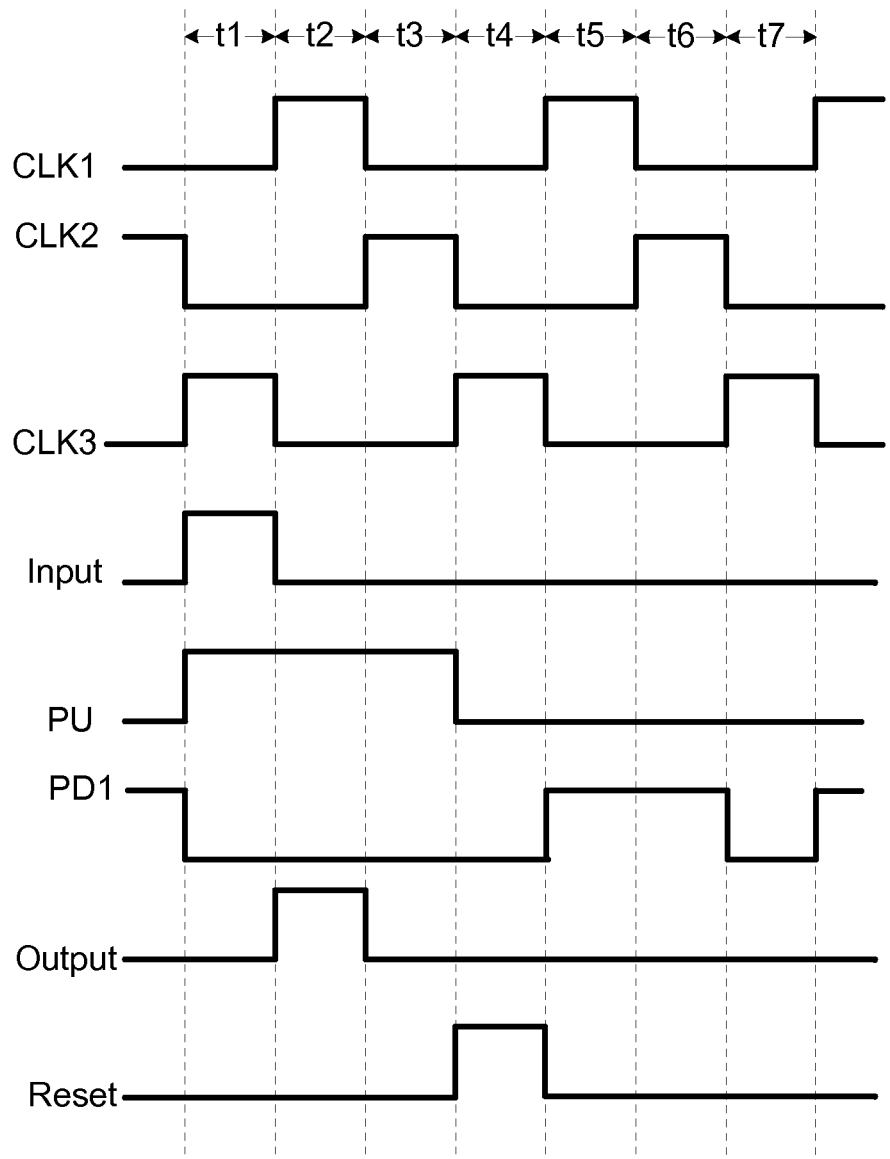
FIG. 7 is another signal timing state diagram for the circuit diagram showing the structure of the GOA unit as shown in FIG. 5 according to an embodiment of the present disclosure.

Further, an embodiment of the present disclosure provides another timing state diagram illustrating the operation principle of the GOA unit shown in FIG. 5. In the timing state diagram, an example where all switching transistors in FIG. 5 are N-type transistors which are turned on at a high level and where the second terminal of the third transistor "T3" is connected to a second control node "PD1" is given. FIG. 7 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the output signal of the output signal terminal "Output", and the reset signal of the reset signal terminal "Reset". The first level terminal "Vss" provides a first voltage. An exemplary first level terminal "Vss" may provide a ground voltage, i.e., zero voltage. As shown in FIG. 7, seven timing states are provided comprising: t1, t2, t3, t4, t5, t6, t7.

At the phase t1, CLK1, CLK2, and Reset are at low levels, CLK3 and Input are at high levels, T1, T2, T4, and T7 are turned on, and T3, T5, T6, T8, and T9 are turned off. At this phase, C1 is charged by receiving the input signal via T1, and PU is at a high level; PD1 receives the first voltage via T4, and therefore PD1 is at a low level; and Output receives the first voltage via T7 such that the output voltage of Output is 0, thereby ensuring the stability of the output signals.

At the phase t2, CLK2, CLK3, Input, and Reset are at low levels, CLK1 is at a high level, T2, T4, and T9 are turned on, and T1, T3, T5, T6, T7, and T8 are turned off. At this phase, PU is kept at a high level due to a bootstrapping effect, and T2 and T4 are turned on; PD1 receives the first voltage via T4, and therefore PD1 is at a low level and T5 and T6 are turned off; and CLK1 inputs the first clock signal to Output via T2.

At the phase t3, CLK1, CLK3, Input, and Reset are at low levels, CLK2 is at a high level, T2, T3, and T4 are turned on, and T1, T5, T6, T7, T8, and T9 are turned off. At this phase, CLK2 receives the first voltage via T3 and T4.

At the phase t4, CLK1, CLK2, and Input are at low levels, CLK3 and Reset are at high levels, T7 and T8 are turned on, and T1, T2, T3, T4, T5, T6, and T9 are turned off. At this phase, Output receives the first voltage via T7, C1 is discharged by receiving the first voltage via T8, and PU is at a low level.

At the phase t5, CLK2, CLK3, Input, and Reset are at low levels, CLK1 is at a high level, T9, T5, and T6 are turned on, and T1, T2, T3, T4, T7, and T8 are turned off. At this phase, since T2 is turned off, the high level signals of CLK1 will not be transmitted to Output, and C1 is discharged by receiving the first voltage via T5 in turn. PU is at a low level, and Output receives the first voltage via T6.

At the phase t6, CLK1, CLK3, Input, and Reset are at low levels, CLK2 is at a high level, T5 and T6 are turned on, and T1, T2, T3, T4, T7, T8, and T9 are turned off. At this phase, C1 is discharged by receiving the first voltage via T5, PU is at a low level, and Output receives the first voltage via T6.

At the phase t7, CLK1, CLK2, Reset, and Input are at low levels, CLK3 is at a high level, T7 is turned on, and T1, T2, T3, T4, T5, T6, T8, and T9 are turned off. At this phase, Output receives the first voltage via T7.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t7, and this is determined by the number of lines scanned by the GOA circuit. However, after the phase t7 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t5, t6, and t7, respectively.

As shown in FIG. 7, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by T relative to the input signal.

In the above embodiment, as compared with the GOA unit shown in FIG. 2, a ninth transistor "T9" is added. When this GOA unit does not provide output and CLK1 is at a high level, the fifth transistor "T5" and the sixth transistor "T6" are turned on. Further, the first voltage of the first level terminal may be pulled to be same as the first control node, and the voltage of the output signal terminal may also be pulled to be same as the first voltage of the first level terminal, thereby ensuring the stability of the output signals.

Figure 8:
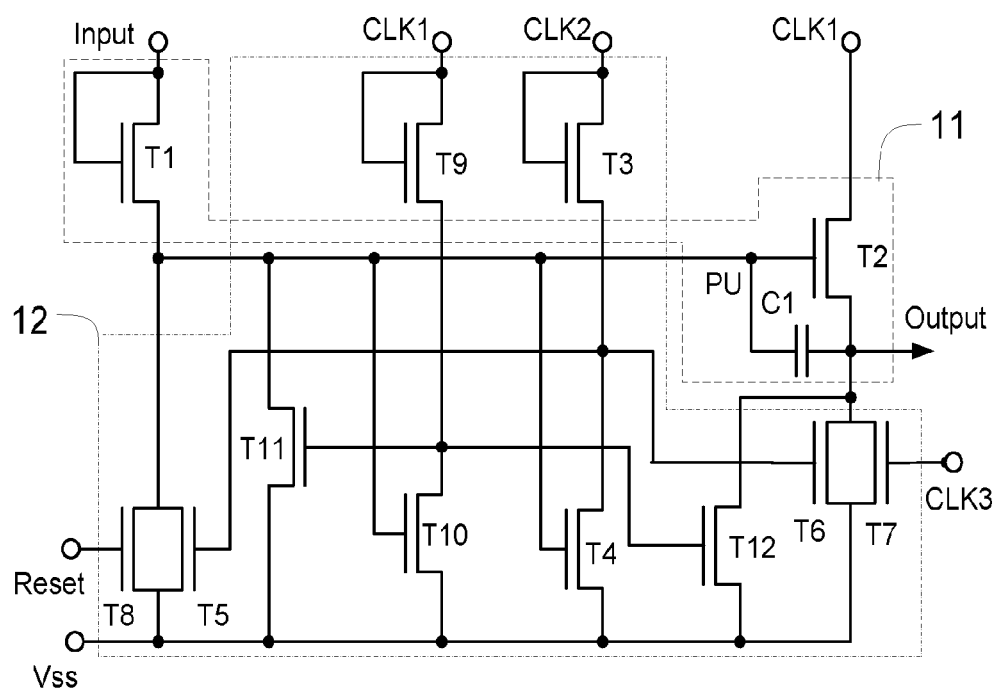
FIG. 8 is a circuit diagram showing a structure of yet another GOA unit according to an embodiment of the present disclosure.

As shown in FIG. 8, an embodiment of the present disclosure provides a GOA unit comprising a first node control module 11 and a second node control module 12.

The first node control module 11 comprises: a first transistor "T1", a second transistor "T2", and a first capacitor "C1".

For the connection modes of T1, T2, and C1, the connection modes of T1, T2, and C1 in the embodiment shown in FIG. 2 may be referred to, and the detailed description thereof is omitted for simplicity.

The second node control module 12 comprises: a third transistor T3, a fourth transistor T4, a fifth transistor T5, a sixth transistor T6, a seventh transistor T7, and an eighth transistor T8.

For the connection modes of T3, T4, T5, T6, T7, and T8, the connection modes of T3, T4, T5, T6, T7, and T8 in the embodiment shown in FIG. 2 may be referred to, and the detailed description thereof is omitted for simplicity.

Further, the second node control module 12 is further connected to the first clock signal terminal CLK1, and the second node control module 12 further comprises: the ninth transistor T9, a tenth transistor T10, an eleventh transistor T11, and a twelfth transistor T12.

The ninth transistor T9 has a gate connected to a first terminal of the ninth transistor T9, the first terminal of the ninth transistor T9 being connected to the first clock signal terminal CLK1 and a second terminal of the ninth transistor T9 being connected to a first terminal of the tenth transistor T10.

The tenth transistor T10 has a gate connected to the first control node PU, the first terminal of the tenth transistor T10 being connected to a gate of the eleventh transistor T11 and a second terminal of the tenth transistor T10 being connected to the first level terminal Vss.

The eleventh transistor T11 has a gate connected to a gate of the twelfth transistor T12, a first terminal of the eleventh transistor T11 being connected to the first control node PU and a second terminal of the eleventh transistor T11 being connected to the first level terminal Vss.

The twelfth transistor T12 has a first terminal connected to the output signal terminal Output and a second terminal connected to the first level terminal Vss.

The above GOA unit comprises: a first node control module and a second node control module. By integrating the first node control module and the second node control module onto the array substrate of the display panel, only the first node control module and the second node control module are used in each GOA unit to provide signals to gate lines of respective pixel lines in the pixel circuit. Compared to a conventional GOA unit, the structure of a GOA circuit according to an embodiment of the present disclosure is simplified, thereby reducing product cost in terms of material and manufacture process.

Figure 9:
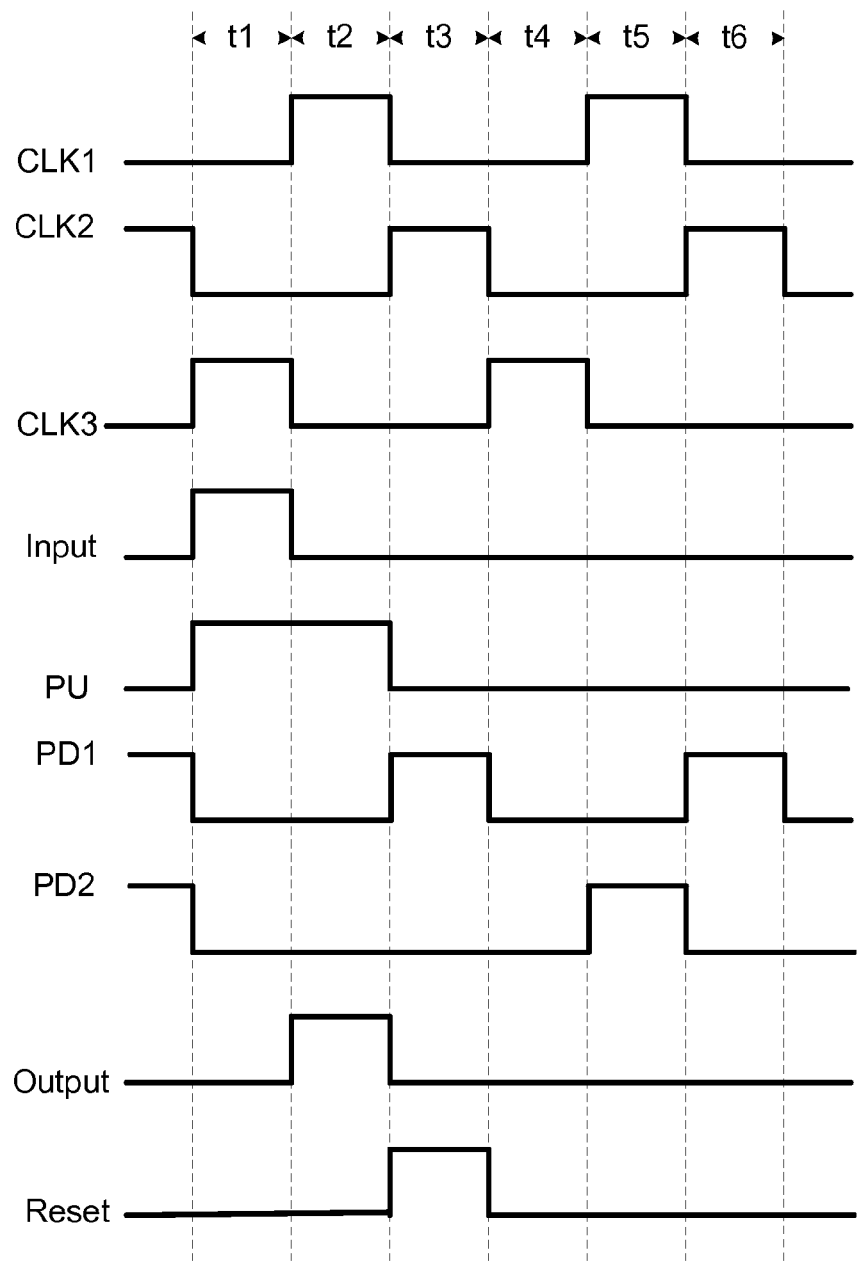
FIG. 9 is a signal timing state diagram for the circuit diagram showing the structure of the GOA unit as shown in FIG. 8 according to an embodiment of the present disclosure.

Below, the operation principle of the GOA unit shown in FIG. 8 will be explained, with reference to the signal timing state diagram shown in FIG. 9 in which an example where all switching transistors in FIG. 8 are N-type transistors which are turned on at a high level and where a second terminal of the third transistor "T3" is connected to a second control node "PD1" and a second terminal of the ninth transistor "T9" is connected to a third control node PD2 is given. FIG. 9 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the signal of the third control node "PD2", the output signal of the output signal terminal "Output", and the reset signal of the reset signal terminal "Reset". The first level terminal "Vss" provides a first voltage. An exemplary first level terminal "Vss" may provide a ground voltage, i.e., zero voltage. As shown in FIG. 9, six timing states are provided comprising: t1, t2, t3, t4, t5, and t6.

At the phase t1, CLK1, CLK2, and Reset are at low levels, CLK3 and Input are at high levels, T1, T2, T4, T7, and T10 are turned on, and T3, T5, T6, T8, T9, T11, and T12 are turned off. At this phase, C1 is charged by receiving the input signal via T1, PU is at a high level, and therefore T2, T4, and T19 are turned on; PD1 receives the first voltage via T4, PD1 is at a low level, and therefore T5 and T6 are turned off; PD2 receives the first voltage via T10, PD2 is at a low level, and therefore T11 and T12 are turned off; and Output receives the first voltage via T7 such that the output voltage of Output is 0, thereby ensuring the stability of the output signals.

At the phase t2, CLK2, CLK3, Input, and Reset are at low levels, CLK1 is at a high level, T2, T4, T9, and T10 are turned on, and T1, T3, T5, T6, T7, T8, T11, and T12 are turned off. At this phase, PU is kept at a high level due to a bootstrapping effect, and T2, T4, and T10 are turned on; PD1 receives the first voltage via T4, PD1 is at a low level, and therefore T5 and T6 are turned off; PD2 receives the first voltage via T10, PD2 is at a low level, and therefore T11 and T12 are turned off; and CLK1 inputs the first clock signal to Output via T2.

At the phase t3, CLK1, CLK3, and Input are at low levels, CLK2 and Reset are at high levels, T3, T5, T6, and T8 are turned on, and T1, T2, T4, T7, T9, T10, T11, and T12 are turned off. At this phase, CLK2 inputs a high level signal to the second control node PD1 via T3, PD1 is at a high level, and therefore T5 and T6 are turned on, Reset inputs a high level signal to the gate of T8, and T8 is turned on; C1 is discharged by receiving the first voltage via T5 and T8, PU is at a low level, and T2 and T4 are turned off; and Output receives the first voltage via T6.

At the phase t4, CLK1, CLK2, Input, and Reset are at low levels, CLK3 is at a high level, T7 is turned on, and T1, T2, T3, T4, T5, T6, T8, T9, T10, T11, and T12 are turned off. At this phase, Output receives the first voltage via T7.

At the phase t5, CLK2, CLK3, Input, and Reset are at low levels, CLK1 is at a high level, T9, T11, and T12 are turned on, and T1, T2, T3, T4, T5, T6, T7, T8, and T10 are turned off. At this phase, since T2 is turned off, the high level signals of CLK1 will not be transmitted to Output, Output is kept at the low level of the phase t4, and C1 is discharged by receiving the first voltage via T5. PU is at a low level, and Output receives the first voltage via T12.

At the phase t6, CLK1, CLK3, Input, and Reset are at low levels, CLK2 is at a high level, T5 and T6 are turned on, and T1, T2, T3, T4, T7, T8, T9, T10, T11, and T12 are turned off. At this phase, C1 is discharged by receiving the first voltage via T5, PU is at a low level, and Output receives the first voltage via T6.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t6, and this is determined by the number of lines scanned by the GOA circuit. However, after the phase t6 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t4, t5, and t6, respectively.

From the above operation principle of the GOA unit, T1 is turned on only when Input is at a high level, and Input is at a high level in only one phase (t1) during a duty cycle; T2, T10, and T4 are turned on only when PU is at a high level, and PU is at a high level in only two phases (t1 and t2) during a duty cycle; T8 is turned on only when Reset is at a high level, and Reset is at a high level in only one phase (t3) during a duty cycle; T9, T11, and T12 are turned on only when CLK1 is at a high level; T3, T5 and T6 are turned on only when CLK2 is at a high level; T7 is turned on only when CLK3 is at a high level, and the pulses input by CLK1, CLK2 and CLK3 are periodic signals with a duty ratio of 1:2. Therefore, the maximum ON time for all transistors in the above GOA unit is 1/3 of one duty cycle, and therefore the life of the GOA unit may be improved.

As shown in FIG. 9, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by 2T/3 relative to the input signal.

Figure 10:
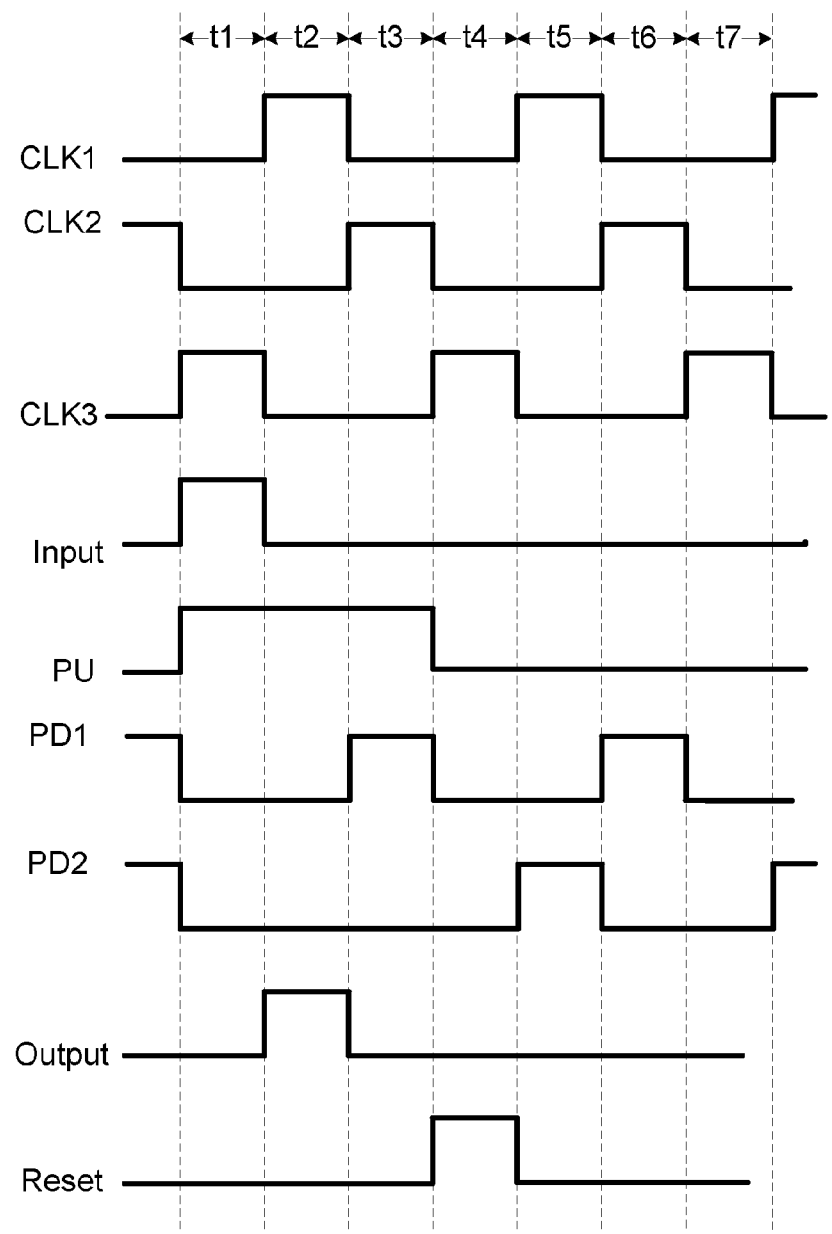
FIG. 10 is another signal timing state diagram for the circuit diagram showing the structure of the GOA unit as shown in FIG. 8 according to an embodiment of the present disclosure.

Further, an embodiment of the present disclosure provides another signal timing state diagram illustrating the operation principle of the GOA unit shown in FIG. 8. In the timing state diagram, an example where all switching transistors in FIG. 8 are N-type transistors which are turned on at a high level and where the second terminal of the third transistor "T3" is connected to a second control node "PD1" and the second terminal of the ninth transistor "T9" is connected to a third control node "PD2" is given. FIG. 10 shows the timing states of the first clock signal "clock1" of the first clock signal terminal "CLK1", the second clock signal "clock2" of the second clock signal terminal "CLK2", the third clock signal "clock3" of the third clock signal terminal "CLK3", the input signal of the input signal terminal "Input", the signal of the first control node "PU", the signal of the second control node "PD1", the signal of the third control node "PD2", the output signal of the output signal terminal "Output", and the reset signal of the reset signal terminal "Reset". The first level terminal "Vss" provides a first voltage. An exemplary first level terminal "Vss" may provide a ground voltage, i.e., zero voltage. As shown in FIG. 10, seven timing states are provided comprising: t1, t2, t3, t4, t5, t6, t7.

At the phase t1, CLK1, CLK2, and Reset are at low levels, CLK3 and Input are at high levels, T1, T2, T4, T7, and T10 are turned on, and T3, T5, T6, T8, T9, T11, and T12 are turned off. At this phase, C1 is charged by receiving the input signal via T1, PU is at a high level, and therefore T2, T4, and T10 are turned on; PD1 receives the first voltage via T4, PD1 is at a low level, and therefore T5 and T6 are turned off; PD2 receives the first voltage via T10, PD2 is at a low level, and therefore T11 and T12 are turned off; and Output receives the first voltage via T7 such that the output voltage of Output is 0, thereby ensuring the stability of the output signals.

At the phase t2, CLK2, CLK3, Input, and Reset are at low levels, CLK1 is at a high level, T2, T4, T9, and T10 are turned on, and T1, T3, T5, T6, T7, T8, T11, and T12 are turned off. At this phase, PU is kept at a high level due to a bootstrapping effect, and T2, T4, and T10 are turned on; PD1 receives the first voltage via T4, PD1 is at a low level and therefore T5 and T6 are turned off; PD2 receives the first voltage via T10, PD2 is at a low level and therefore T11 and T12 are turned off; and CLK1 inputs the first clock signal to Output via T2.

At the phase t3, CLK1, CLK3, Input, and Reset are at low levels, CLK2 is at a high level, T2, T3, T4, and T10 are turned on, and T1, T5, T6, T7, T8, T9, T11, and T12 are turned off. At this phase, CLK2 receives the first voltage via T3 and T4.

At the phase t4, CLK1, CLK2, and Input are at low levels, CLK3 and Reset are at high levels, T7 and T8 are turned on, and T1, T2, T3, T4, T5, T6, T9, T10, T11, and T12 are turned off. At this phase, Output receives the first voltage via T7, C1 is discharged by receiving the first voltage via T8, and the voltage of PU is pulled low.

At the phase t5, CLK2, CLK3, Input, and Reset are at low levels, CLK1 is at a high level, T9, T11, and T12 are turned on, and T1, T2, T3, T4, T5, T6, T7, T8, and T10 are turned off. At this phase, since T2 is turned off, the high level signals of CLK1 will not be transmitted to Output, and C1 is discharged by receiving the first voltage via T11. PU is at a low level, and Output receives the first voltage via T12.

At the phase t6, CLK1, CLK3, Input, and Reset are at low levels, CLK2 is at a high level, T5 and T6 are turned on, and T1, T2, T3, T4, T7, T8, T9, T10, T11, and T12 are turned off.

At this phase, Output receives the first voltage via T6, C1 is discharged by receiving the first voltage via T5, and PU is at a low level.

At the phase t7, CLK1, CLK2, Reset, and Input are at low levels, CLK3 is at a high level, T7 is turned on, and T1, T2, T3, T4, T5, T6, T8, T9, T10, T11, and T12 are turned off. At this phase, Output receives the first voltage via T7.

Further, although an example of a complete duty cycle for the present stage GOA unit from the phase t1 when a high level is input by Input to the phase when a high level is input by Input of the present stage GOA unit again is given above, there may be more phases in one duty cycle for the present stage GOA unit after the above phase t7, and this is determined by the number of lines scanned by the GOA circuit. However, after the phase t7 and before a high level is input by Input of the present stage GOA unit again, Input and Reset of the present stage GOA unit are kept at low levels. The states of various transistors in the present stage GOA unit vary periodically as the clock signals of CLK1, CLK2, and CLK3 vary. The states of various transistors in the present stage GOA unit sequentially repeat the states of various transistors of the GOA unit at the phases t5, t6, and t7, respectively.

From the above operation principle of the GOA unit, T1 is turned on only when Input is at a high level, and Input is at a high level in only one phase (t1) during a duty cycle; T2, T10, and T4 are turned on only when PU is at a high level, and PU is at a high level in only three phases (t1, t2, and t3) during a duty cycle; T8 is turned on only when Reset is at a high level, and Reset is at a high level in only one phase (t4) during a duty cycle; T9 is turned on only when CLK1 is at a high level, and T11 and T12 are turned on only when CLK1 is at a high level and PU is at a low level; T3 is only turned on when CLK2 is at a high level; T5 and T6 are turned on only when CLK2 is at a high level and PU is at a low level; T7 is turned on only when CLK3 is at a high level, and the pulses input by CLK1, CLK2 and CLK3 are periodic signals with a duty ratio of 1:2. Therefore, the maximum ON time for all transistors in the above GOA unit is 1/3 of one duty cycle, and therefore the life of the GOA unit may be improved.

As shown in FIG. 10, in the embodiment of the present disclosure, the periodicities of the first clock signal, the second clock signal, and the third clock signal are T with a duty ratio of 1/3 and a phase shift of 120° to each other. In other words, the second clock signal is delayed by T/3 relative to the first clock signal, and the third clock signal is delayed by T/3 relative to the second clock signal. The input signal is applied in synchronization with one trigger edge of the third clock signal, and the input signal lasts for T/3. The reset signal is delayed by T relative to the input signal.

According to an embodiment of the present disclosure, a GOA circuit is provided comprising any of GOA units according to the above embodiments. To be specific, the GOA unit may be a GOA unit corresponding to any of embodiments of FIG. 2, FIG. 5, and FIG. 8.

Figure 11:
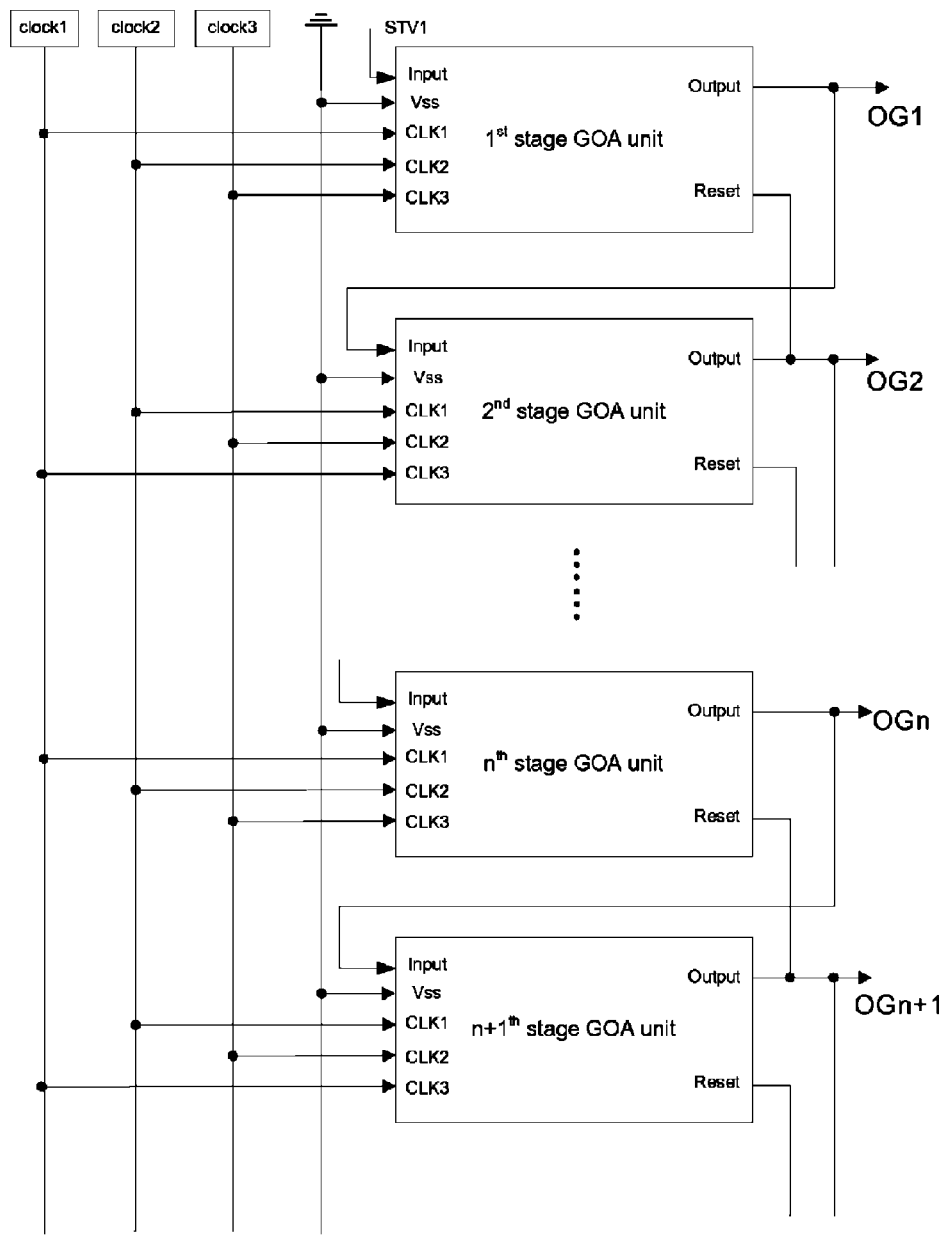
FIG. 11 is a diagram showing a structure of a GOA circuit according to an embodiment of the present disclosure.

Alternatively, as shown in FIG. 11, the GOA circuit comprises: at least two cascaded GOA units which are referred to as the $1^{st}$ stage GOA unit, the $2^{nd}$ stage GOA unit, . . . , the $n^{th}$ stage GOA unit.

The $1^{st}$ stage GOA unit has an input signal terminal connected to a frame initial signal terminal which inputs a first frame initial signal STV1, and the $1^{st}$ stage GOA unit has a reset signal terminal connected to an output signal terminal of the $2^{nd}$ stage GOA unit.

The $m^{th}$ stage GOA unit has an input signal terminal connected to an output signal terminal of the $m-1^{th}$ stage GOA unit, and the $m^{th}$ stage GOA unit has a reset signal terminal connected to an output signal terminal of the $m+1^{th}$ stage GOA unit, where n is a positive integer equal to or greater than 2 and m={2, . . . , n−1}.

The last stage GOA unit is typically a dummy unit, and has a reset signal terminal connected to the frame initial signal terminal, such that the last stage GOA unit is reset by the frame initial signal STV1 when the next cycle is coming, thereby achieving the loop of timings. Therefore, the reset signal terminal of the $n^{th}$ stage GOA unit may be connected to the initial signal terminal (not shown in FIG. 11).

In this embodiment, timing signals of Reset in the GOA unit correspond to timing signals of Reset in the timing signal diagrams shown in FIG. 3, FIG. 6, and FIG. 9. In other words, Reset signal is at a high level in the phase t3.

To be specific, as shown in FIG. 11, the GOA circuit comprises several cascaded GOA units, wherein the $1^{st}$ stage GOA unit has an output terminal Output connected to the gate line "OG1" and also to the input terminal "Input" of the $2^{nd}$ stage GOA unit. The input signal terminal of the $1^{st}$ stage GOA unit inputs a first frame initial signal STV1, and the $1^{st}$ stage GOA unit has a reset signal terminal "Reset" connected to the output signal terminal of the $2^{nd}$ stage GOA unit. The $2^{nd}$ stage GOA unit has an output terminal "Output" connected to the gate line OG2 and also to the input terminal "Input" of the $3^{rd}$ stage GOA unit. The $2^{nd}$ stage GOA unit has a reset signal terminal "Reset" is connected to the output signal terminal of the $3^{rd}$ stage GOA unit. Other GOA units of this GOA circuit are connected in accordance with this mode.

Each GOA unit has a first clock signal terminal CLK1, a second clock signal terminal CLK2, a third clock signal terminal CLK3, and a level input terminal. As shown in FIG. 11, clock signals are provided to the three clock signal terminals connected to each GOA unit by three system clock signals clock1-3. CLK1 of the $1^{st}$ stage GOA unit inputs clock1, CLK2 of the $1^{st}$ stage GOA unit inputs clock2, and CLK3 of the $1^{st}$ stage GOA unit inputs clock3. CLK1 of the $2^{nd}$ stage GOA unit inputs clock2, CLK2 of the $2^{nd}$ stage GOA unit inputs clock3, and CLK3 of the $2^{nd}$ stage GOA unit inputs clock1. When this GOA circuit further comprises the $3^{rd}$ stage GOA unit, CLK1 of the $3^{rd}$ stage GOA unit inputs clock3, CLK2 of the $3^{rd}$ stage GOA unit inputs clock1, and CLK3 of the $3^{rd}$ stage GOA unit inputs clock2. When this GOA circuit comprises even more GOA units, for the $m^{th}$ stage GOA unit, in the case where m=1+3x (x is a positive integer), each of clock signal terminals of the $m^{th}$ stage GOA unit inputs the same clock signals as those for the $1^{st}$ stage GOA unit; in the case where m=2+3x (x is a positive integer), each of clock signal terminals of the $m^{th}$ stage GOA unit inputs the same clock signals as those for the $2^{nd}$ stage GOA unit; and in the case where m=3+3x (x is a positive integer), each of clock signal terminals of the $m^{th}$ stage GOA unit inputs the same clock signals as those for the $3^{rd}$ stage GOA unit.

The timing states of the system clock are shown in FIG. 3, FIG. 6, and FIG. 9. clock1, clock2, and clock 3 have a same waveform. clock1, clock2, and clock 3 are clock signals with a duty ratio of 1:2. Each cycle of clock1, clock2, and clock 3 contains one single pulse, wherein the pulse rising edge of clock1 is in advance of that of clock2 by one single pulse width, and the pulse rising edge of clock2 is in advance of that of clock3 by one single pulse width. The above pulses are explained with an example where the pulse widths are same.

Figure 12:
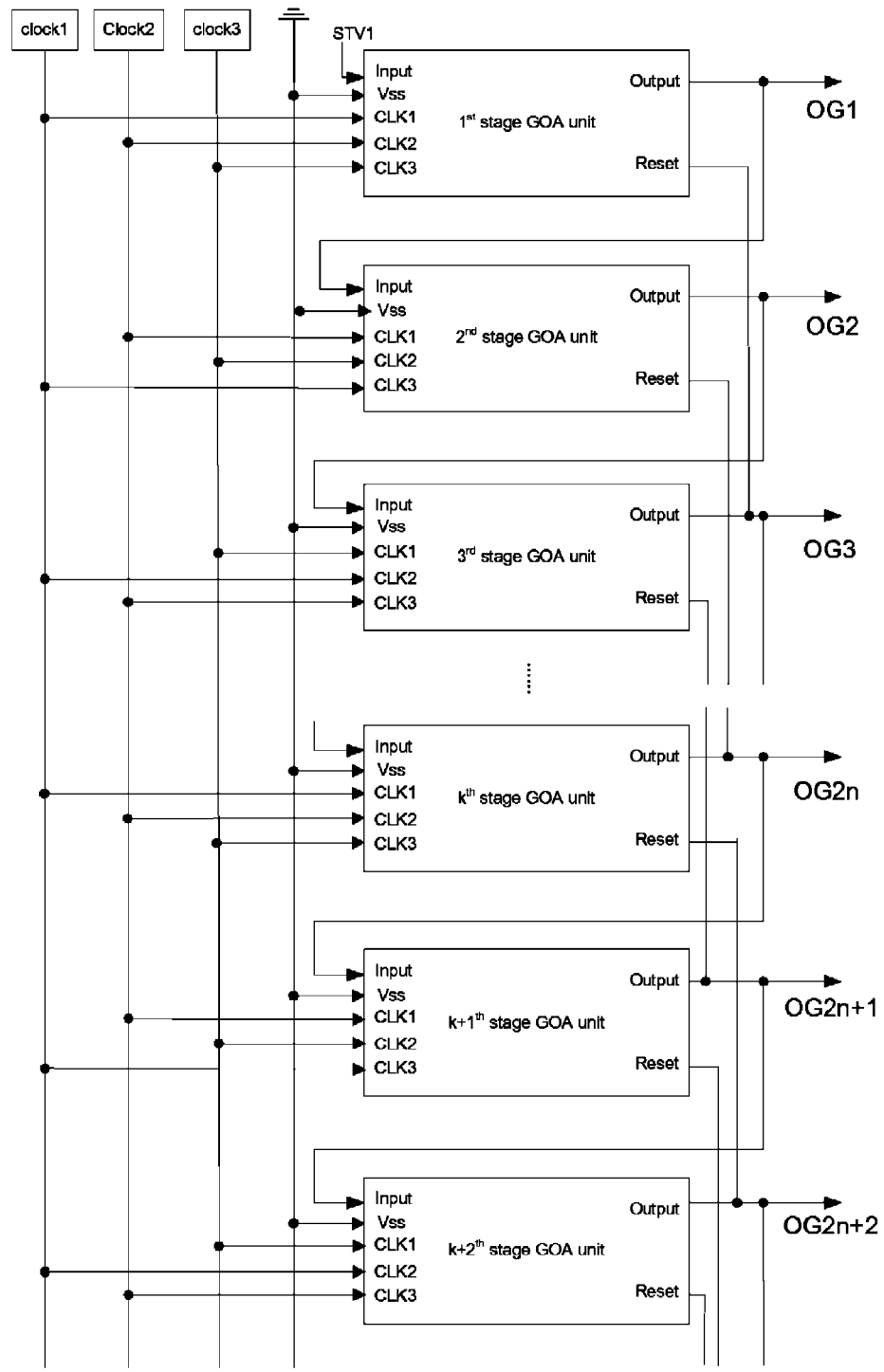
FIG. 12 is a diagram showing a structure of another GOA circuit according to an embodiment of the present disclosure.

Alternatively, as shown in FIG. 12, the GOA circuit comprises: at least three cascaded GOA units, which are referred to as the $1^{st}$ stage GOA unit, the $2^{nd}$ stage GOA unit, . . . , the $n^{th}$ stage GOA unit.

The $1^{st}$ stage GOA unit has an input signal terminal which inputs a first frame initial signal STV1, and the $1^{st}$ stage GOA unit has a reset signal terminal connected to an output signal terminal of the $3^{rd}$ stage GOA unit.

The $k^{th}$ stage GOA unit has an input signal terminal connected to an output signal terminal of the k-$1^{th}$ stage GOA unit, and the $k^{th}$ stage GOA unit has a reset signal terminal connected to an output signal terminal of the k+$2^{th}$ stage GOA unit.

The k+$1^{th}$ stage GOA unit has an input signal terminal connected to an output signal terminal of the $k^{th}$ stage GOA unit, and the k+$1^{th}$ stage GOA unit has a reset signal terminal connected to an output signal terminal of the k+$3^{th}$ stage GOA unit, where n is a positive integer greater than or equal to 3 and k={2, . . . , n−3}.

The last two stage GOA units are typically dummy units, and have reset signal terminals connected to the frame initial signal terminal, such that the last stage GOA unit is reset by the frame initial signal STV1 when the next cycle is coming, thereby achieving the loop of timings. Therefore, the n−$1^{th}$ stage GOA unit and the $n^{th}$ stage GOA unit have reset signal terminals connected to the frame initial signal terminal (not shown in FIG. 12).

In this embodiment, timing signals of Reset in the GOA unit correspond to timing signals of Reset in the timing signal diagrams shown in FIG. 4, FIG. 7, and FIG. 10. In other words, Reset signal is at a high level in the phase t4.

According to an embodiment of the present disclosure, a GOA circuit is further provided comprising any of GOA units according to the above embodiments. To be specific, the GOA unit may be a GOA unit corresponding to any of embodiments of FIG. 2, FIG. 5, and FIG. 8.

In particular, as shown in FIG. 12, the GOA circuit comprises several cascaded GOA units, wherein the $1^{st}$ stage GOA unit has an output terminal Output connected to the gate line "OG1" and also to the input terminal "Input" of the $2^{nd}$ stage GOA unit. The input signal terminal of the $1^{st}$ stage GOA unit inputs a first frame initial signal STV1, and the $1^{st}$ stage GOA unit has a reset signal terminal "Reset" connected to the output signal terminal of the $3^{rd}$ stage GOA unit. The $2^{nd}$ stage GOA unit has an output terminal "Output" connected to the gate line OG2 and also to the input terminal "Input" of the $3^{rd}$ stage GOA unit. The $2^{nd}$ stage GOA unit has a reset signal terminal "Reset" is connected to the output signal terminal of the $4^{th}$ stage GOA unit. The $3^{rd}$ stage GOA unit has an output terminal Output connected to the gate line "OG3" and also to the input terminal "Input" of the $4^{th}$ stage GOA unit. The $3^{rd}$ stage GOA unit has a reset signal terminal "Reset" connected to the output signal terminal of the $5^{th}$ stage GOA unit. Other GOA units of this GOA circuit are connected in accordance with this mode.

Each GOA unit has a first clock signal terminal CLK1, a second clock signal terminal CLK2, a third clock signal terminal CLK3, and a level input terminal. As shown in FIG. 11, clock signals are provided to the three clock signal terminals connected to each GOA unit by three system clock signals clock1-3. CLK1 of the $1^{st}$ stage GOA unit inputs clock1, CLK2 of the $1^{st}$ stage GOA unit inputs clock2, and CLK3 of the $1^{st}$ stage GOA unit inputs clock3. CLK1 of the $2^{nd}$ stage GOA unit inputs clock2, CLK2 of the $2^{nd}$ stage GOA unit inputs clock3, and CLK3 of the $2^{nd}$ stage GOA unit inputs clock1. CLK1 of the $3^{rd}$ stage GOA unit inputs clock3, CLK2 of the $3^{rd}$ stage GOA unit inputs clock1, and CLK3 of the $3^{rd}$ stage GOA unit inputs clock2. When this GOA circuit comprises more GOA units, for every three consecutive GOA units, a cycle is thus formed in such a way, and detailed description thereof is omitted for simplicity.

The timing states of the system clock are shown in FIG. 4, FIG. 7, and FIG. 10. clock1, clock2, and clock 3 have a same waveform. clock1, clock2, and clock 3 are clock signals with a duty ratio of 1:2. Each cycle of clock1, clock2, and clock 3 contains one single pulse, wherein the pulse rising edge of clock1 is in advance of that of clock2 by one single pulse width, and the pulse rising edge of clock2 is in advance of that of clock3 by one single pulse width. The above pulses are explained with an example where the pulse widths are same.

The GOA unit in the GOA circuit provided by the above embodiment comprises: a first node control module and a second node control module. By integrating the first node control module and the second node control module onto the array substrate of the display panel, only the first node control module and the second node control module are used in each GOA unit to provide signals to gate lines of respective pixel lines in the pixel circuit. Compared to a conventional GOA circuit, a GOA circuit according to an embodiment of the present disclosure has a simpler structure, thereby reducing product cost in terms of material and manufacture process.

According to an embodiment of the present disclosure, a display device is provided comprising any of the GOA circuits according to the above embodiments.

Further, the display device may be: e-paper, mobile phone, tablet, TV, display, laptop, digital photo frame, navigator or any other product or component with a display function.

The GOA unit in the display device provided by the above embodiment comprises: a first node control module and a second node control module. By integrating the first node control module and the second node control module onto the array substrate of the display panel, the integrated circuit portion of the GOA circuit may be omitted. Compared to a conventional gate driver, a GOA circuit according to an embodiment of the present disclosure has a simpler structure, thereby reducing product cost in terms of material and manufacture process.

According to an embodiment of the present disclosure, a method for driving a GOA unit is provided. The method for driving the GOA unit is used for a GOA unit corresponding to any of embodiments of FIG. 2, FIG. 5, and FIG. 8.

Figure 13:
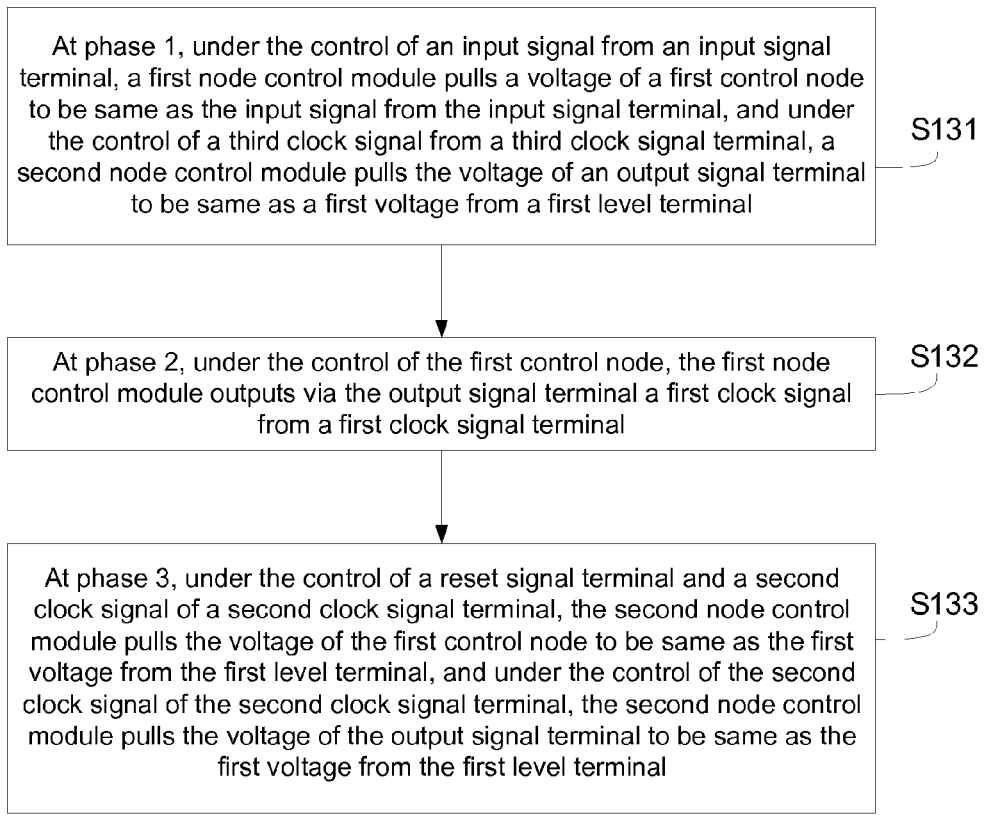
FIG. 13 is a flow chart showing a method for driving a GOA unit according to an embodiment of the present disclosure.

As shown in FIG. 13, the method for driving a GOA unit comprises steps of:

S131. At phase 1, under the control of an input signal from an input signal terminal, a first node control module pulls a voltage of a first control node to be same as the input signal from the input signal terminal, and under the control of a third clock signal from a third clock signal terminal, a second node control module pulls the voltage of an output signal terminal to be same as a first voltage from a first level terminal.

S132. At phase 2, under the control of the first control node, the first node control module outputs via the output signal terminal a first clock signal from a first clock signal terminal.

S133. At phase 3, under the control of a reset signal terminal and a second clock signal of a second clock signal terminal, the second node control module pulls the voltage of the first control node to be same as the first voltage from the first level terminal, and under the control of the second clock signal of the second clock signal terminal, the second node control module pulls the voltage of the output signal terminal to be same as the first voltage from the first level terminal.

Further, after the above phase 3, the method for driving the GOA unit further comprises: phase 4, phase 5, phase 6, or even more phases. At phase 4, the first voltage of the first level terminal is output by the output signal terminal. At phase 5, the first control node and the output signal terminal are kept at low levels. At phase 6, the first control node is pulled to be same as the first level of the first level terminal, and the first level of the first level terminal is output at the output signal terminal. After phase 6 and before the next high level is input at the input signal terminal "Input", Input and Reset are both kept at low levels. With the clock pulses which are input periodically by the third clock signal terminal, the first clock signal terminal, and the second clock signal terminal, the transistors in the GOA unit repeat the states of the transistors in the GOA unit in phase 4, phase 5, and phase 6, until phase 1 is restarted. A cycle from phase 1 to next phase 1 is referred to as an operation cycle for a GOA unit.

In the method for driving the GOA unit provided in the above embodiment, at phase 1, the voltage of the first control node is pulled to be same as the input signal of the input signal terminal by the first node control module, the voltage of the output signal terminal is pulled to be same as the first voltage of the first level terminal by the second node control module; at phase 2, the first clock signal of the first clock signal terminal is output at the output signal terminal by the first node control module; and at phase 3, the voltage of the first control node is pulled to be same as the first voltage of the first level terminal and the voltage of the output signal terminal is pulled to be same as the first voltage of the first level terminal by the second node control module. Compared to a conventional GOA unit, a GOA unit according to an embodiment of the present disclosure has a simpler structure, and therefore the structure of a GOA circuit is simplified, thereby reducing product cost in terms of materials and manufacture process.

Alternatively, the first node control module comprises: a first transistor, a second transistor, and a first capacitor.

The method further comprises: at the phase 1, the first transistor is turned on, the second transistor is turned on, and the first capacitor is charged; at the phase 2, the first transistor is turned off, the second transistor is turned on, and the first capacitor is kept at a high level; and at the phase 3, the first transistor is turned off, the second transistor is turned off, and the first capacitor is discharged.

Alternatively, the second node control module comprises: a third transistor, a fourth transistor, a fifth transistor, a sixth transistor, a seventh transistor, and an eighth transistor.

The method further comprises: at the phase 1, the third transistor is turned off, the fourth transistor is turned on, the fifth transistor is turned off, the sixth transistor is turned off, the seventh transistor is turned on, and the eighth transistor is turned off; at the phase 2, the third transistor is turned off, the fourth transistor is turned on, the fifth transistor is turned off, the sixth transistor is turned off, the seventh transistor is turned off, and the eighth transistor is turned off; and at the phase 3, the third transistor is turned on, the fourth transistor is turned off, the fifth transistor is turned on, the sixth transistor is turned on, the seventh transistor is turned off, and the eighth transistor is turned on.

The GOA unit, which performs the above method for driving the GOA unit, is composed of 8 transistors and 1 capacitor. Compared to a 12T1C GOA unit structure composed of 12 transistors and 1 capacitor in the related art, the structure of the GOA unit is simplified, and therefore the structure of the GOA circuit is simplified, thereby reducing product cost in terms of material and manufacture process. Further, space for wiring occupied by the GOA unit in the display panel can be reduced, and therefore the requirement for a narrow bezel may be further met.

Alternatively, the second node control module further comprises: a ninth transistor.

At the phase 1, the ninth transistor is turned off; at the phase 2, the ninth transistor is turned on; and at the phase 3, the ninth transistor is turned off.

In the GOA unit which performs the above method for driving the GOA unit, a ninth transistor is added. When this GOA unit does not provide output and the first clock signal is at a high level, the fifth transistor and the sixth transistor are turned on. The first voltage of the first level terminal may be pulled to be same as the first control node, and the voltage of the output signal terminal may also be pulled to be same as the first voltage of the first level terminal, thereby ensuring the stability of the output signals.

Alternatively, the second node control module further comprises: a ninth transistor, a tenth transistor, an eleventh transistor, and a twelfth transistor.

At the phase 1, the ninth transistor is turned off, the tenth transistor is turned on, the eleventh transistor is turned off, and the twelfth transistor is turned off; at the phase 2, the ninth transistor is turned on, the tenth transistor is turned on, the eleventh transistor is turned off, and the twelfth transistor is turned off; and at the phase 3, the ninth transistor is turned off, the tenth transistor is turned off, the eleventh transistor is turned off, and the twelfth transistor is turned off.

In the above method for driving the GOA unit, the first transistor is turned on only when the input signal of the input signal terminal is at a high level, and the input signal of the input signal terminal is at a high level in only phase 1 during a duty cycle; the second transistor, the fourth transistor, and the tenth transistor are turned on only when the first control node is at a high level, and the first control node is at a high level in only two phases (phase 1 and phase 2) during a duty cycle; the eighth transistor is turned on only when the reset signal of the reset signal terminal is at a high level, and the signal of the reset signal terminal is at a high level in only one phase (phase 3) during a duty cycle; the ninth transistor is turned on only when the first clock signal of the first clock signal terminal is at a high level, and the eleventh transistor and the twelfth transistor are turned on only when the first clock signal of the first clock signal terminal is at a high level and the first control node is at a low level; the third transistor is only turned on when the second clock signal of the second clock signal terminal is at a high level; the fifth transistor and the sixth transistor are turned on only when the second clock signal of the second clock signal terminal is at a high level and the first control node is at a low level; the seventh transistor is turned on only when the third clock signal of the third clock signal terminal is at a high level, and the pulses input by the first clock signal terminal, the second clock signal terminal, and the third clock signal terminal are periodic signals with a duty ratio of 1:2. Therefore, the maximum ON time for all transistors in the above GOA unit is 1/3 of one duty cycle, and therefore the life of the GOA unit may be improved.

According to an embodiment of the present disclosure, a method for driving a GOA unit is provided. The method for driving the GOA unit is used for a GOA unit corresponding to any of embodiments of FIG. 2, FIG. 5, and FIG. 8.

Figure 14:
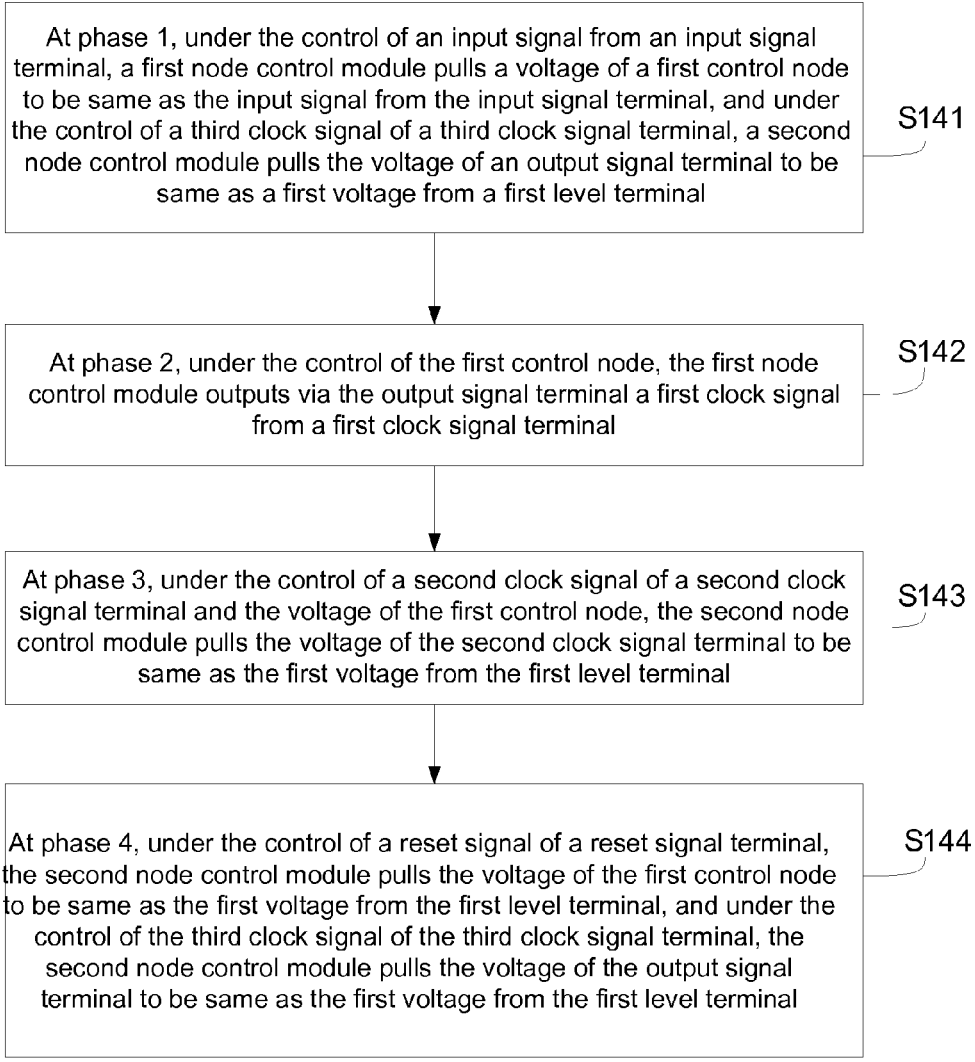
FIG. 14 is a flow chart showing another method for driving a GOA unit according to an embodiment of the present disclosure.

As shown in FIG. 14, the method for driving a GOA unit comprises steps of:

S141. At phase 1, under the control of an input signal from an input signal terminal, a first node control module pulls a voltage of a first control node to be same as the input signal from the input signal terminal, and under the control of a third clock signal terminal, a second node control module pulls the voltage of an output signal terminal to be same as a first voltage from a first level terminal.

S142. At phase 2, under the control of the first control node, the first node control module outputs via the output signal terminal a first clock signal from a first clock signal terminal.

S143. At phase 3, under the control of a second clock signal of a second clock signal terminal and the voltage of the first control node, the second node control module pulls the voltage of the second clock signal terminal to be same as the first voltage from the first level terminal.

S144. At phase 4, under the control of a reset signal of a reset signal terminal, the second node control module pulls the voltage of the first control node to be same as the first voltage from the first level terminal, and under the control of the third clock signal of the third clock signal terminal, the second node control module pulls the voltage of the output signal terminal to be same as the first voltage from the first level terminal.

Further, after the above phase 4, the method for driving the GOA unit may further comprise: phase 5, phase 6, phase 7, or even more phases. At phase 5, the first control node and the output signal terminal are kept at low levels. At phase 6, the first control node is pulled to be same as the first level of the first level terminal, and the first voltage output by the first level terminal is pulled to be same as the voltage of the output signal terminal. At phase 7, the voltage of the output signal terminal is pulled to be same as the first voltage of the first level terminal. After phase 7 and before the next high level is input at the input signal terminal "Input", Input and Reset are both kept at low levels. With the clock pulses which are input periodically by the first clock signal terminal, the second clock signal terminal, and the third clock signal terminal, the transistors in the GOA unit repeat the states of the transistors in the GOA unit in phase 5, phase 6, and phase 7, until phase 1 is restarted. A cycle from phase 1 to next phase 1 is referred to as an operation cycle for a GOA unit.

In the method for driving the GOA unit provided in the above embodiment, at phase 1, the voltage of the first control node is pulled to be same as the input signal of the input signal terminal by the first node control module, the voltage of the output signal terminal is pulled to be same as the first voltage of the first level terminal by the second node control module; at phase 2, the first clock signal of the first clock signal terminal is output at the output signal terminal by the first node control module; at phase 3, the voltage of the second clock signal terminal is pulsed to be same as the first voltage from the first level terminal by the second node control module; and at phase 4, the voltage of the first control node is pulled to be same as the first voltage of the first level terminal and the voltage of the output signal terminal is pulled to be same as the first voltage of the first level terminal by the second node control module. Compared to a conventional GOA unit, a GOA unit according to an embodiment of the present disclosure has a simpler structure, and therefore the structure of a GOA circuit is simplified, thereby reducing product cost in terms of materials and manufacture process.

Alternatively, the first node control module comprises: a first transistor, a second transistor, and a first capacitor.

The method further comprises: at the phase 1, the first transistor is turned on, the second transistor is turned on, and the first capacitor is charged; at the phase 2, the first transistor is turned off, the second transistor is turned on, and the first capacitor is kept at a high level; at the phase 3, the first transistor is turned off, the second transistor is turned on, and the first capacitor is kept at a high level; and at the phase 4, the first transistor is turned off, the second transistor is turned off, and the first capacitor is kept at a low level and discharged.

Alternatively, the second node control module comprises: a third transistor, a fourth transistor, a fifth transistor, a sixth transistor, a seventh transistor, and an eighth transistor.

The method further comprises: at the phase 1, the third transistor is turned off, the fourth transistor is turned on, the fifth transistor is turned off, the sixth transistor is turned off, the seventh transistor is turned on, and the eighth transistor is turned off; at the phase 2, the third transistor is turned off, the fourth transistor is turned on, the fifth transistor is turned off, the sixth transistor is turned off, the seventh transistor is turned off, and the eighth transistor is turned off; at the phase 3, the third transistor is turned on, the fourth transistor is turned on, the fifth transistor is turned off, the sixth transistor is turned off, the seventh transistor is turned off, and the eighth transistor is turned off; and at the phase 4, the third transistor is turned off, the fourth transistor is turned off, the fifth transistor is turned off, the sixth transistor is turned off, the seventh transistor is turned off, and the eighth transistor is turned on.

The GOA unit, which performs the above method for driving the GOA unit, is composed of 8 transistors and 1 capacitor. Compared to a 12T1C GOA unit structure composed of 12 transistors and 1 capacitor in the related art, the structure of the GOA unit is simplified, and therefore the structure of the GOA circuit is simplified, thereby reducing product cost in terms of material and manufacture process. Further, space for wiring occupied by the GOA unit in the display panel can be reduced, and therefore the requirement for a narrow bezel may be further met.

Alternatively, the second node control module further comprises: a ninth transistor.

At the phase 1, the ninth transistor is turned off; at the phase 2, the ninth transistor is turned on; at the phase 3, the ninth transistor is turned off; and at the phase 4, the ninth transistor is turned off.

In the GOA unit which performs the above method for driving the GOA unit, a ninth transistor is added. When this GOA unit does not provide output and the first clock signal is at a high level, the fifth transistor and the sixth transistor are turned on. The first voltage of the first level terminal may be pulled to be same as the first control node, and the voltage of the output signal terminal may also be pulled to be same as the first voltage of the first level terminal, thereby ensuring the stability of the output signals.

Alternatively, the second node control module further comprises: a ninth transistor, a tenth transistor, an eleventh transistor, and a twelfth transistor.

At the phase 1, the ninth transistor is turned off, the tenth transistor is turned on, the eleventh transistor is turned off, and the twelfth transistor is turned off; at the phase 2, the ninth transistor is turned on, the tenth transistor is turned on, the eleventh transistor is turned off, and the twelfth transistor is turned off; at the phase 3, the ninth transistor is turned off, the tenth transistor is turned on, the eleventh transistor is turned off, and the twelfth transistor is turned off; and at the phase 4, the ninth transistor is turned off, the tenth transistor is turned off, the eleventh transistor is turned off, and the twelfth transistor is turned off.

In the above method for driving the GOA unit, the first transistor is turned on only when the input signal of the input signal terminal is at a high level, and the input signal of the input signal terminal is at a high level in only phase 1 during a duty cycle; the second transistor, the fourth transistor, and the tenth transistor are turned on only when the first control node is at a high level, and the first control node is at a high level in only three phases (phase 1, phase 2, and phase 3) during a duty cycle; the eighth transistor is turned on only when the reset signal of the reset signal terminal is at a high level, and the signal of the reset signal terminal is at a high level in only one phase (phase 4) during a duty cycle; the ninth transistor is turned on only when the first clock signal of the first clock signal terminal is at a high level, and the eleventh transistor and the twelfth transistor are turned on only when the first clock signal of the first clock signal terminal is at a high level and the first control node is at a low level; the third transistor is only turned on when the second clock signal of the second clock signal terminal is at a high level; the fifth transistor and the sixth transistor are turned on only when the second clock signal of the second clock signal terminal is at a high level and the first control node is at a low level; the seventh transistor is turned on only when the third clock signal of the third clock signal terminal is at a high level, and the pulses of the first clock signal terminal, the second clock signal terminal, and the third clock signal terminal are periodic signals with a duty ratio of 1:2. Therefore, the maximum ON time for all transistors in the above GOA unit is 1/3 of one duty cycle, and therefore the life of the GOA unit may be improved.

The above description is merely some specific implementations of the present disclosure, and the scope of the present disclosure is not limited thereto. Any change or substitution which can be easily contemplated by those skilled in the art within the scope of the present disclosure may fall into the scope of the present disclosure. Therefore, the scope of the present disclosure is only defined by the claims.

I claim:

1. A GOA unit, comprising a first node control module and a second node control module,
    wherein the first node control module is connected to a first control node, an input signal terminal, a first clock signal terminal, and an output signal terminal, and the first node control module is configured to, under the control of an input signal from the input signal terminal, pull a voltage of the first control node to be equal to a voltage of the input signal from the input signal terminal, and further configured to, under the control of the first control node, output via the output signal terminal a first clock signal from the first clock signal terminal, and
    wherein the second node control module is connected to a reset signal terminal, a second clock signal terminal, a third clock signal terminal, a first level terminal, the output signal terminal, and the first control node, and the second node control module is configured to, under the control of a reset signal of the reset signal terminal and a second clock signal of the second clock signal terminal, pull the voltage of the first control node to be equal to a first voltage of the first level terminal, and further configured to, under the control of the first control node, a second clock signal from the second clock signal terminal, and a third clock signal from the third clock signal terminal, pull a voltage of the output signal terminal to be equal to the first voltage of the first level terminal;
    wherein the second node control module comprises a third transistor, a fourth transistor, a fifth transistor, a sixth transistor, a seventh transistor, and an eighth transistor, and
    wherein the third transistor has a gate connected to a first terminal of the third transistor, the first terminal of the third transistor being connected to the second clock signal terminal and a second terminal of the third transistor being connected to a first terminal of the fourth transistor,
    wherein the fourth transistor has a gate connected to the first control node, a second terminal of the fourth transistor being connected the first level terminal,
    wherein the fifth transistor has a gate connected to the second terminal of the third transistor, a first terminal of the fifth transistor being connected to the first control node and a second terminal of the fifth transistor being connected to the first level terminal,
    wherein the sixth transistor has a gate connected to the second terminal of the third transistor, a first terminal of the sixth transistor being connected to the output signal terminal and a second terminal of the sixth transistor being connected to the first level terminal,
    wherein the seventh transistor has a gate connected to the third clock signal terminal, a first terminal of the seventh transistor being connected to the output signal terminal and a second terminal of the seventh transistor being connected to the first level terminal, and
    wherein the eighth transistor has a gate connected to the reset signal terminal, a first terminal of the eighth transistor being connected to the first control node and a second terminal of the eighth transistor being connected to the first level terminal.

2. The GOA unit according to claim 1, wherein the first node control module comprises a first transistor, a second transistor, and a first capacitor, and
    wherein the first transistor has a gate connected to a first terminal of the first transistor, the first terminal of the first transistor being connected to the input signal terminal and a second terminal of the first transistor being connected to the first control node,
    wherein the second transistor has a gate connected to the first control node, a first terminal of the second transistor being connected to the first clock signal terminal and a second terminal of the second transistor being connected to the output signal terminal, and
    wherein the first capacitor has a first plate connected to the first control node and a second plate connected to the output signal terminal.

3. The GOA unit according to claim 1, wherein the second node control module is further connected to the first clock signal terminal, and wherein the second node control module further comprises a ninth transistor,
    wherein the ninth transistor has a gate connected to a first terminal of the ninth transistor, the first terminal of the ninth transistor being connected to the first clock signal terminal and a second terminal of the ninth transistor being connected to the second terminal of the third transistor.

4. The GOA unit according to claim 1, wherein the second node control module is further connected to the first clock signal terminal, and wherein the second node control module further comprises a ninth transistor, a tenth transistor, an eleventh transistor, and a twelfth transistor, wherein the ninth transistor has a gate connected to a first terminal of the ninth transistor, the first terminal of the ninth transistor being connected to the first clock signal terminal and a second terminal of the ninth transistor being connected to a first terminal of the tenth transistor, wherein the tenth transistor has a gate connected to the first control node, the first terminal of the tenth transistor being connected to a gate of the eleventh transistor and a second terminal of the tenth transistor being connected to the first level terminal, wherein the eleventh transistor has a gate connected to a gate of the twelfth transistor, a first terminal of the eleventh transistor being connected to the first control node and a second terminal of the eleventh transistor being connected to the first level terminal, and wherein the twelfth transistor has a first terminal connected to the output signal terminal and a second terminal connected to the first level terminal.

5. A GOA circuit, comprising at least one GOA unit according to claim 1.

6. The GOA circuit according to claim 5, wherein the GOA circuit comprises at least two cascaded GOA units which are referred to as the $1^{st}$ stage GOA unit, the $2^{nd}$ stage GOA unit, ..., the $n^{th}$ stage GOA unit, wherein the $1^{st}$ stage GOA unit has an input signal terminal connected to a frame initial signal terminal which inputs a first frame initial signal, and the $1^{st}$ stage GOA unit has a reset signal terminal connected to an output signal terminal of the $2^{nd}$ stage GOA unit, wherein the $m^{th}$ stage GOA. unit has an input signal terminal connected to an output signal terminal of the $m-1^{th}$ stage GOA unit, and the $m^{th}$ stage GOA unit has a reset signal terminal connected to an output signal terminal of the $m+1^{th}$ stage GOA unit, and wherein the $n^{th}$ stage GOA unit has a reset signal terminal connected to the frame initial signal terminal, where n is a positive integer equal to or greater than 2 and m={2, ..., n-1}.

7. The GOA circuit according to claim 5, wherein the GOA circuit comprises at least three cascaded GOA units, which are referred to as the $1^{st}$ stage GOA unit, the $2^{nd}$ stage GOA unit, ..., the $n^{th}$ stage GOA unit, wherein the $1^{st}$ stage GOA unit has an input signal terminal connected to a frame initial signal terminal which inputs a first frame initial signal, and the $1^{st}$ stage GOA unit has a reset signal terminal connected to an output signal terminal of the $3^{rd}$ stage GOA unit, wherein the $k^{th}$ stage GOA unit has an input signal terminal connected to an output signal terminal of the $k-1^{th}$ stage GOA unit, and the $k^{th}$ stage GOA unit has a reset signal terminal connected to an output signal terminal of the $k+2^{th}$ stage GOA unit, and wherein the $n-1^{th}$ stage GOA unit has a reset signal terminal connected to the frame initial signal terminal and the $n^{th}$ stage GOA unit has a reset signal terminal connected to the frame initial signal terminal, where n is a positive integer equal to or greater than 3 and k={2, ..., n-3}.

8. A display device, comprising a GOA circuit according to claim 5.

9. A method for driving a GOA unit of claim 1, comprising:

at phase 1, under the control of the input signal from the input signal terminal, the first node control module pulls the voltage of the first control node to be equal to the voltage of the input signal from the input signal terminal, and under the control of the third clock signal from the third clock signal terminal, the second node control module pulls the voltage of the output signal terminal to be equal to the first voltage of the first level terminal;

at phase 2, under the control of the first control node, the first node control module outputs via the output signal terminal the first clock signal from the first clock signal terminal; and at phase 3, under the control of the reset signal of the reset signal terminal and the second clock signal of the second clock signal terminal, the second node control module pulls the voltage of the first control node to be equal to the first voltage from the first level terminal, and under the control of the second clock signal of the second clock signal terminal, the second node control module pulls the voltage of the output signal terminal to be equal to the first voltage from the first level terminal;

wherein the second node control module comprises a third transistor, a fourth transistor, a fifth transistor, a sixth transistor, a seventh transistor, and an eighth transistor, and wherein the method further comprises:

at the phase 1, the third transistor is turned off, the fourth transistor is turned on, the fifth transistor is turned off, the sixth transistor is turned off, the seventh transistor is turned on, and the eighth transistor is turned off;

at the phase 2, the third transistor is turned off, the fourth transistor is turned on, the fifth transistor is turned off, the sixth transistor is turned off, the seventh transistor is turned off, and the eighth transistor is turned off; and at the phase 3, the third transistor is turned on, the fourth transistor is turned off, the fifth transistor is turned on, the sixth transistor is turned on, the seventh transistor is turned off, and the eighth transistor is turned on.

10. The method for driving a GOA unit according to claim 9, wherein the first node control module comprises a first transistor, a second transistor, and a first capacitor, and wherein the method further comprises:

at the phase 1, the first transistor is turned on, the second transistor is turned on, and the first capacitor is charged;

at the phase 2, the first transistor is turned off, the second transistor is turned on, and the first capacitor is kept at a high level; and at the phase 3, the first transistor is turned off, the second transistor is turned off, and the first capacitor is discharged.

11. The method for driving a GOA unit according to claim 9, wherein the second node control module further comprises a ninth transistor, and wherein at the phase 1, the ninth transistor is turned off;

at the phase 2, the ninth transistor is turned on; and at the phase 3, the ninth transistor is turned off.

12. The method for driving a GOA unit according to claim 9, wherein the second node control module further comprises: a ninth transistor, a tenth transistor, an eleventh transistor, and a twelfth transistor, and wherein at the phase 1, the ninth transistor is turned off, the tenth transistor is turned on, the eleventh transistor is turned off, and the twelfth transistor is turned off;

at the phase 2, the ninth transistor is turned on, the tenth transistor is turned on, the eleventh transistor is turned off, and the twelfth transistor is turned off; and at the phase 3, the ninth transistor is turned off, the tenth transistor is turned off, the eleventh transistor is turned off, and the twelfth transistor is turned off.

13. A method for driving a GOA unit of claim 1, comprising:
- at phase 1, under the control of the input signal from the input signal terminal, the first node control module pulls the voltage of the first control node to be equal to the voltage of the input signal from the input signal terminal, and under the control of the third clock signal from the third clock signal terminal, the second node control module pulls the voltage of the output signal terminal to be equal to the first voltage from the first level terminal;
- at phase 2, under the control of the first control node, the first node control module outputs via the output signal terminal the first clock signal from the first clock signal terminal;
- at phase 3, under the control of the second clock signal of the second clock signal terminal and the voltage of the first control node, the second node control module pulls the voltage of the second clock signal terminal to be equal to the first voltage from the first level terminal; and
- at phase 4, under the control of the reset signal of the reset signal terminal, the second node control module pulls the voltage of the first control node to be equal to the first voltage from the first level terminal, and under the control of the third clock signal of the third clock signal terminal, the second node control module pulls the voltage of the output signal terminal to be equal to the first voltage from the first level terminal;
- wherein the second node control module comprises: a third transistor, a fourth transistor, a fifth transistor, a sixth transistor, a seventh transistor, and an eighth transistor, and
- wherein the method further comprises:
- at the phase 1, the third transistor is turned off, the fourth transistor is turned on, the fifth transistor is turned off, the sixth transistor is turned off, the seventh transistor is turned on, and the eighth transistor is turned off;
- at the phase 2, the third transistor is turned off, the fourth transistor is turned on, the fifth transistor is turned off, the sixth transistor is turned off, the seventh transistor is turned off, and the eighth transistor is turned off;
- at the phase 3, the third transistor is turned on, the fourth transistor is turned on, the fifth transistor is turned off, the sixth transistor is turned off, the seventh transistor is turned off, and the eighth transistor is turned off; and
- at the phase 4, the third transistor is turned off, the fourth transistor is turned off, the fifth transistor is turned off, the sixth transistor is turned off, the seventh transistor is turned off, and the eighth transistor is turned on.

14. The method for driving a GOA unit according to claim 13, wherein the first node control module comprises: a first transistor, a second transistor, and a first capacitor, and wherein the method further comprises:
- at the phase 1, the first transistor is turned on, the second transistor is turned on, and the first capacitor is charged;
- at the phase 2, the first transistor is turned off, the second transistor is turned on, and the first capacitor is kept at a high level;
- at the phase 3, the first transistor is turned off, the second transistor is turned on, and the first capacitor is kept at a high level; and
- at the phase 4, the first transistor is turned off, the second transistor is turned off, and the first capacitor is discharged.

15. The method for driving a GOA unit according to claim 14, wherein the second node control module further comprises a ninth transistor, and wherein
- at the phase 1, the ninth transistor is turned off;
- at the phase 2, the ninth transistor is turned on;
- at the phase 3, the ninth transistor is turned off; and
- at the phase 4, the ninth transistor is turned off.

16. The method for driving a GOA unit according to claim 14, wherein the second node control module further comprises: a ninth transistor, a tenth transistor, an eleventh transistor, and a twelfth transistor, and wherein
- at the phase 1, the ninth transistor is turned off, the tenth transistor is turned on, the eleventh transistor is turned off, and the twelfth transistor is turned off; at the phase 2, the ninth transistor is turned on, the tenth transistor is turned on, the eleventh transistor is turned off, and the twelfth transistor is turned off;
- at the phase 3, the ninth transistor is turned off, the tenth transistor is turned on, the eleventh transistor is turned off, and the twelfth transistor is turned off; and
- at the phase 4, the ninth transistor is turned off, the tenth transistor is turned off, the eleventh transistor is turned off, and the twelfth transistor is turned off.

* * * * *